(12) United States Patent
Eitan et al.

(10) Patent No.: US 8,189,397 B2
(45) Date of Patent: May 29, 2012

(54) RETENTION IN NVM WITH TOP OR BOTTOM INJECTION

(75) Inventors: Boaz Eitan, Hofit (IL); Maria Kushnir, Nesher (IL); Assaf Shappir, Kiryat Ono (IL)

(73) Assignee: Spansion Israel Ltd, Netanya (IL)

( * ) Notice: Subject to any disclaimer, the term of this patent is extended or adjusted under 35 U.S.C. 154(b) by 537 days.

(21) Appl. No.: 12/318,767

(22) Filed: Jan. 8, 2009

(65) Prior Publication Data
US 2009/0175089 A1 Jul. 9, 2009

Related U.S. Application Data

(60) Provisional application No. 61/006,354, filed on Jan. 8, 2008.

(51) Int. Cl.
*G11C 11/34* (2006.01)

(52) U.S. Cl. .................. 365/185.25; 257/315

(58) Field of Classification Search ............. 365/185.05, 365/185.25; 257/315, 316
See application file for complete search history.

(56) References Cited

U.S. PATENT DOCUMENTS

| | | | |
|---|---|---|---|
| 4,538,196 A | 8/1985 | Sun et al. | |
| 4,547,599 A | 10/1985 | Schneider et al. | |
| 4,547,617 A | 10/1985 | Welch | |
| 4,870,470 A * | 9/1989 | Bass et al. | 257/324 |
| 4,939,559 A * | 7/1990 | DiMaria et al. | 257/38 |
| 5,286,994 A | 2/1994 | Ozawa et al. | |
| 5,319,229 A | 6/1994 | Shimoji et al. | |
| 5,746,591 A | 5/1998 | Yao | |
| 5,952,692 A | 9/1999 | Nakazato et al. | |
| 5,963,465 A | 10/1999 | Eitan | |
| 5,966,603 A | 10/1999 | Eitan | |
| 6,011,725 A | 1/2000 | Eitan | |
| 6,026,026 A | 2/2000 | Chan et al. | |
| 6,030,871 A | 2/2000 | Eitan | |
| 6,074,917 A | 6/2000 | Chang et al. | |
| 6,133,095 A | 10/2000 | Eitan et al. | |
| 6,169,693 B1 | 1/2001 | Chan et al. | |
| 6,215,148 B1 | 4/2001 | Eitan | |
| 6,218,700 B1 | 4/2001 | Papadas | |
| 6,233,180 B1 | 5/2001 | Eitan et al. | |
| 6,285,574 B1 | 9/2001 | Eitan | |
| 6,292,394 B1 | 9/2001 | Cohen et al. | |
| 6,395,644 B1 | 5/2002 | Hoppeer et al. | |
| 6,448,750 B1 | 9/2002 | Shor et al. | |
| 6,477,084 B1 | 11/2002 | Eitan | |

(Continued)

OTHER PUBLICATIONS

A Novel Gate-Injection Program/Erase P-Channel NAND-Type Flash Memory with High (10M Cycle Endurance), Hang-Ting Lue et al., Macronix International Co. Ltd., 2007 Symposium on VLSI Technology Digest of Papers, 978-4-900784-03-1, pp. 140-141.

(Continued)

*Primary Examiner* — Son Dinh
(74) *Attorney, Agent, or Firm* — Eitan Mehulal Law Group

(57) ABSTRACT

Retention of charges in a nonvolatile memory (NVM) cell having a nitride-based injector (such as SiN, SIRN, SiON) for facilitating injection of holes into a charge-storage layer (for NROM, nitride) of a charge-storage stack (for NROM, ONO) may be improved by providing an insulating layer (for NROM, oxide) between the charge-storage layer and the injector has a thickness of at least 3 nm. Top and bottom injectors are disclosed. Methods of operating NVM cells are disclosed. The NVM cell may be NROM, SONOS, or other oxide-nitride technology NVM cells such as SANOS, MANOS, TANOS.

60 Claims, 7 Drawing Sheets

U.S. PATENT DOCUMENTS

| | | |
|---|---|---|
| 6,512,696 B1 | 1/2003 | Fan et al. |
| 6,583,007 B1 | 6/2003 | Eitan |
| 6,633,496 B2 | 10/2003 | Mayyan et al. |
| 6,709,928 B1 | 3/2004 | Jenne et al. |
| 6,720,630 B2 | 4/2004 | Mandelman et al. |
| 6,784,480 B2 * | 8/2004 | Bhattacharyya ............. 257/314 |
| 6,818,558 B1 | 11/2004 | Rathor et al. |
| 6,897,533 B1 | 5/2005 | Yang et al. |
| 6,912,163 B2 | 6/2005 | Zheng et al. |
| 6,933,219 B1 * | 8/2005 | Lingunis et al. ............. 438/593 |
| 6,942,320 B2 | 9/2005 | Chung et al. |
| 6,954,393 B2 | 10/2005 | Lusky et al. |
| 6,967,896 B2 | 11/2005 | Eisen et al. |
| 7,062,619 B2 | 6/2006 | Dvir et al. |
| 7,075,828 B2 | 7/2006 | Lue et al. |
| 7,115,469 B1 | 10/2006 | Halliyal et al. |
| 7,115,942 B2 | 10/2006 | Wang |
| 7,133,313 B2 | 11/2006 | Shih |
| 7,135,734 B2 | 11/2006 | Eldridge et al. |
| 7,151,692 B2 | 12/2006 | Wu |
| 7,157,769 B2 | 1/2007 | Forbes |
| 7,164,603 B2 | 1/2007 | Shih et al. |
| 7,187,590 B2 | 3/2007 | Zous et al. |
| 7,190,614 B2 | 3/2007 | Wu |
| 7,209,390 B2 | 4/2007 | Lue et al. |
| 7,315,474 B2 | 1/2008 | Lue |
| 2005/0006696 A1 | 1/2005 | Noguchi et al. |
| 2005/0157549 A1 | 7/2005 | Mokhlesi et al. |
| 2005/0219906 A1 | 10/2005 | Wu |
| 2005/0237801 A1 | 10/2005 | Shih |
| 2005/0237809 A1 | 10/2005 | Shih et al. |
| 2005/0237813 A1 | 10/2005 | Zous et al. |
| 2005/0237815 A1 | 10/2005 | Lue et al. |
| 2005/0237816 A1 | 10/2005 | Lue et al. |
| 2005/0281085 A1 | 12/2005 | Wu |
| 2006/0084219 A1 | 4/2006 | Lusky et al. |
| 2006/0198189 A1 | 9/2006 | Lue et al. |
| 2006/0202252 A1 | 9/2006 | Wang et al. |
| 2006/0202261 A1 | 9/2006 | Lue et al. |
| 2006/0281260 A1 | 12/2006 | Lue |
| 2007/0029625 A1 | 2/2007 | Lue et al. |
| 2007/0159880 A1 | 7/2007 | Eitan et al. |
| 2007/0195607 A1 | 8/2007 | Eitan et al. |
| 2008/0251831 A1 | 10/2008 | Wu et al. |

OTHER PUBLICATIONS

BE-SONOS: A Bandgap Engineered SONOS with Excellent Performance and Reliability, Hang-Ting Lue et al., Macronix International Co. Ltd., © 2005, IEEE 0-7803-9269-8/05.

Eitan et al., NROM: A Novel Localized Trapping 2-Bit Nonvolatile Memory Cell, IEEE Electron Device Lett. vol. 21, No. 11, pp. 543-545 (2000).

Shapira et al., Unified Retention Model for localized charge-trapping nonvolatile memory device, Appl. Phys, Lett. 92, 133514 (2008).

*Layered tunnel barriers for nonvolatile memory devices*, Likharev, Appl. Phys. Lett., vol. 73, No. 15, Oct. 1998.

*VARIOT: a novel multilayer tunnel barrier concept for low-voltage non-volatile memory devices*, Govoreanu et al., IEEE Electron Device Letters, pp. 99-101, 2003 . . . IEEE electron device letters, pp. 99-101, 2003.

Reliability Model of Bandgap Engineered SONOS (BE-SONOS), Lue et al., MXIC IEDM, IEEE, 2006.

*Material Issues for Layered Tunnel Barrier Structures*, Casperon et al., Journal of Applied Physics, vol. 92, Nr. 1, Jul. 2002.

*Silicon-Nitride as a Tunnel Dielectric for Improved SONOS-Type Flash Memory*, She et al, IEEE Electron Device Letters, vol. 24, No. 5, May 2003.

*JVD Silicon Nitride sa Tunnel Dielectric in p-Channel Flash Memory*, She et al., IEEE Electron Device Letters, vol. 23, No. 2, Feb. 2002.

J. D. Bude, et al., "Secondary Electron Flash—a High Performance, Low Power Flash Technology for 0.35.mu.m and Below", IEDM 97, pp. 279-282.

J. D. Bude, et al., "EEPROM/Flash Sub 3.0V Drain-Source Bias Hot Carrier Writing", IEDM 95, pp. 989-992.

J. D. Bude and M. R. Pinto, "Modeling Nonequilibrium Hot Carrier Device Effects", Conference of Insulator Specialists of Europe, Sweden, Jun. 1997.

Scalable 2-bit silicon-oxide-nitride-oxide-silicon (SONOS) memory with physically separated local nitrides under a merged gate, Lee et al., (Samsung), Solid State Electronics 48 (2004), pp. 1771-1775.

CHISEL Flash EEPROM—Part I: Performance and Scaling, Mahapatra, Shukuri, Bude, IEEE Transactions on Electron Devices, vol. 49. No. 7, Jul. 2002.

CHISEL Programming Operation of Scaled NOR Flash EEPROMs—Effect of Voltage Scaling, Device Scaling and Technological Parameters, Mohapatra, Nair, Mahapatra, Rao, Shukuri, Bude, IEEE Transactions on Electron Devices, vol. 50. No. 10, Oct. 2003.

Joe E Brewer et al, "Nonvolatile Memory Technologies With Emphasis On Flash, A Comprehensive Guide to Understanding and Using NVM Devices", IEEE Press, Wiley-Interscience, A John Wiley & Sons, Inc Publication 2007.

Alexander Korotkov et al, "Resonant Fowler-Nordheim Tunneling through Layered Tunnel Barriers and its Possible Applications"—State University of New York, Stony Brook, NY 11794-3800, USA, D:\Likharev\Nano\Reviews\IEDM_99\Preprint Copy doc.

* cited by examiner

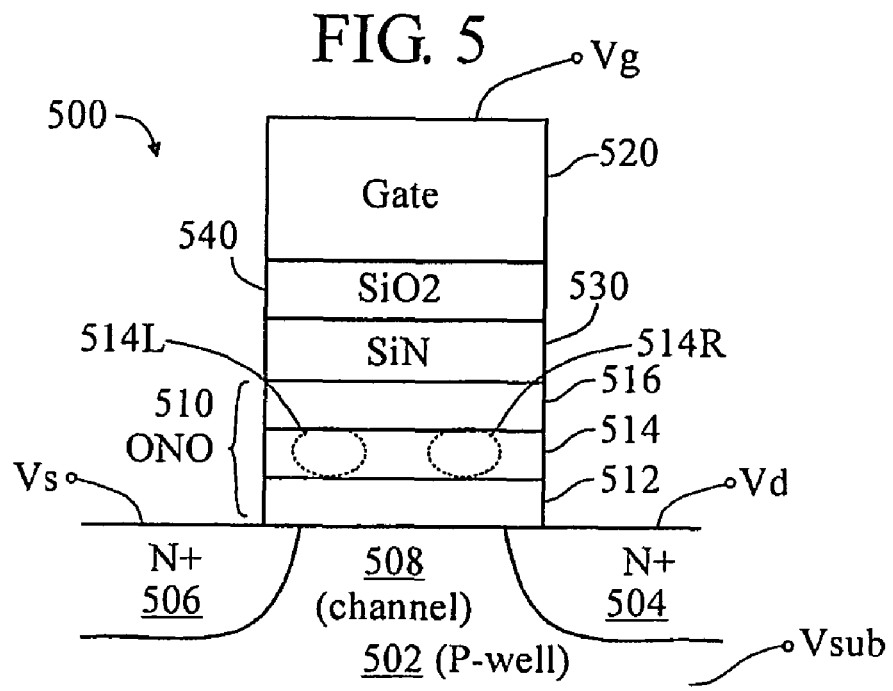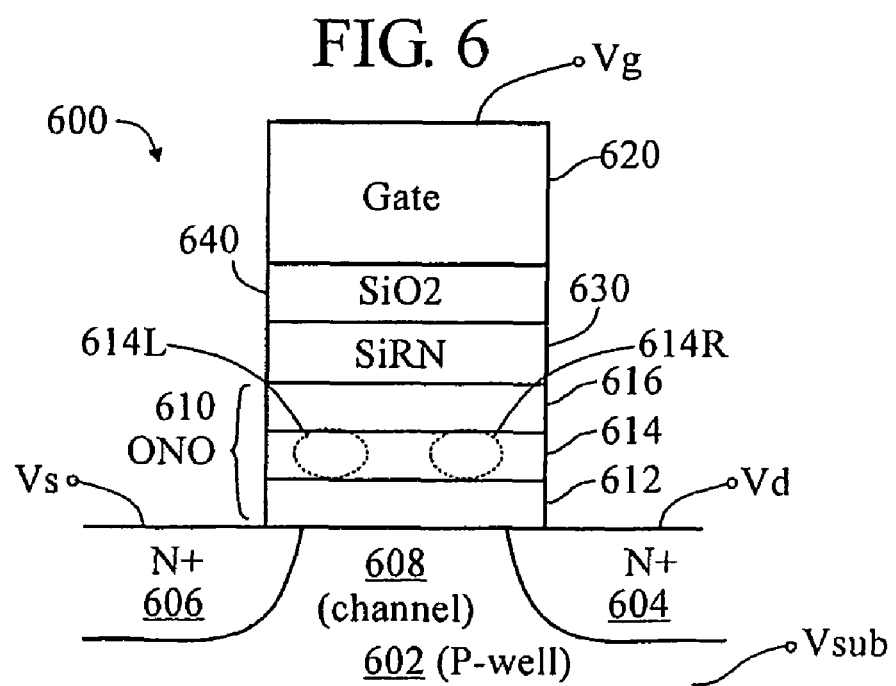

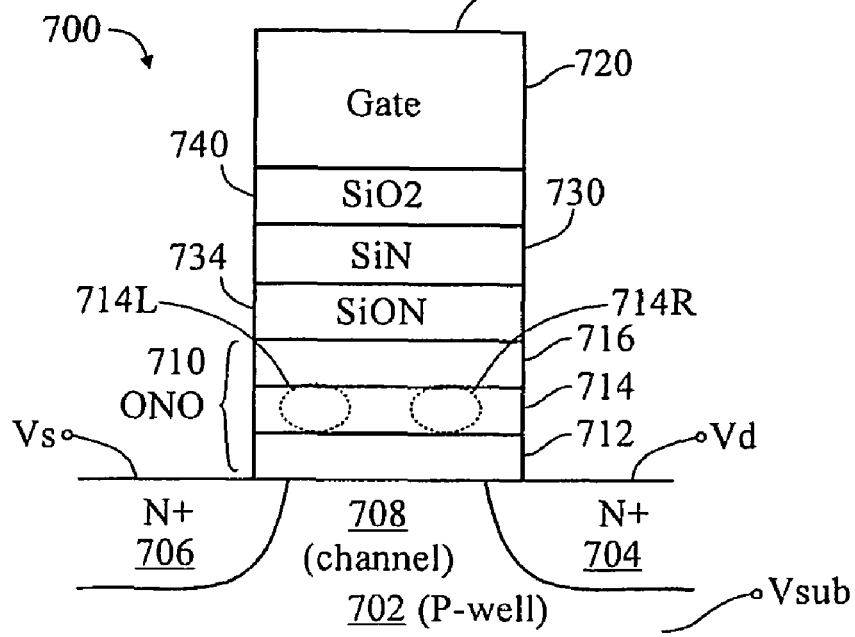
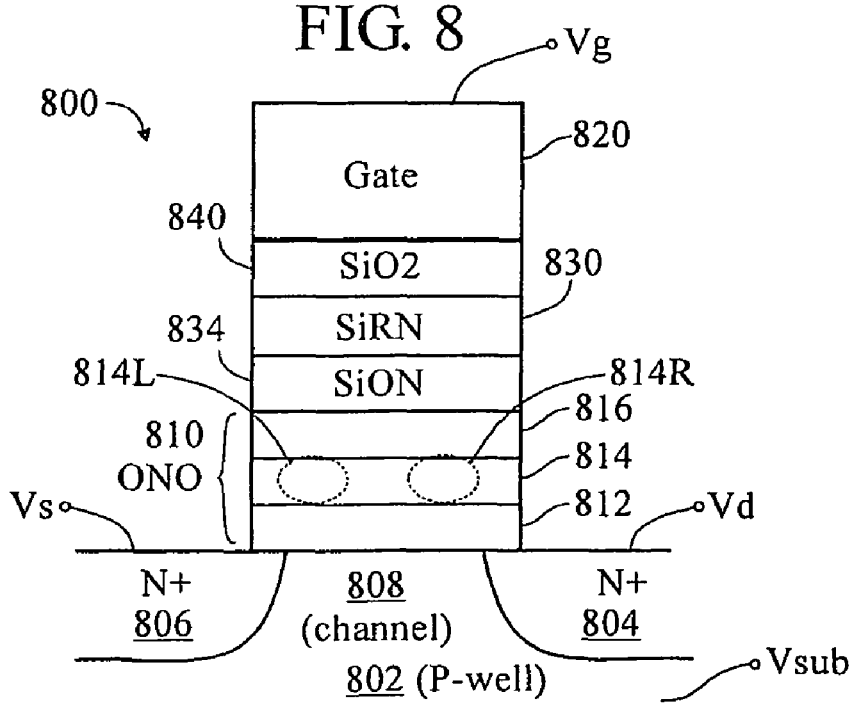

RETENTION IN NVM WITH TOP OR BOTTOM INJECTION

CROSS-REFERENCE(S) TO RELATED APPLICATION(S)

This is a non-provisional filing based on U.S. Provisional Application No. 61/006,354, filed 8 Jan. 2008, which is incorporated in its entirety by reference herein.

TECHNICAL FIELD

This disclosure relates to the structure and operation of nitride read only memory (NROM) and other NVM cells using oxide-nitride technology, and other microelectronic devices and structures.

BACKGROUND

The NROM cell is a type of non-volatile memory (NVM) cell. The NROM cell is basically an n-channel MOSFET (metal-oxide-silicon, field effect transistor) device with an ONO (oxide-nitride-oxide) stack as a gate dielectric. Using nitride (silicon nitride, $Si_3N_4$) as a charge-trapping layer enables electrons (or holes) to be stored in two separate charge-storage areas, which may be referred to as two "bits", or two "half-cells". See, for example, Eitan et al., NROM: *A Novel Localized Trapping 2-Bit Nonvolatile Memory Cell*, IEEE Electron Device Lett. Vol 21, no. 11, pp 543-545 (2000), incorporated by reference in its entirety herein.

Generally, the quantity of electrons (or holes) stored in a given charge-storage area will control the threshold voltage of the half cell, and can be controlled to correspond to at least two distinct program levels. In a single-level cell (SLC) there may be two threshold voltage distributions representing, for example, binary "0" and binary "1". In a multi-level cell (MLC), there may be four (or more) threshold voltage distributions representing, for example, binary "00", "01", "10" and "11". A lowest one of the threshold voltage distributions may represent an erase state, and the other threshold voltage distributions may represent program state(s).

Programming of the NROM cell may be performed by Channel Hot Electron (CHE) injection or channel-initiated secondary electron (CHISEL) injection, to increase the threshold voltage of the half cell. Erase of the NROM cell may be performed by band-to-band Tunnel Assisted Hot Hole Injection (HHI), to reduce the threshold voltage of the half cell. Reading of the NROM cell may be performed by a reverse read method, to ascertain the threshold voltage of the half cell.

Structure of a Conventional ("Standard") NROM Cell

FIG. 1 is a cross-sectional view, of an exemplary NROM memory cell 100 generally comprising a substrate 102, a first diffusion 104 extending into the substrate 102 from a top (as viewed) surface thereof, a second diffusion 106 extending into the substrate 102 from a top (as viewed) surface thereof, a channel 108 disposed between the first diffusion 104 and the second diffusion 106, and an ONO stack 110 ("charge-storage stack") disposed on the top surface of the substrate 102. The ONO stack 110 comprises a first (or "bottom") oxide layer 112, a nitride ("charge-storage") layer 114 disposed on the bottom oxide layer 112, and a second (or "top") oxide layer 116 disposed on the storage layer 114. The storage nitride layer 114 may comprise two charge storage areas (or "bits"), a right "bit" 114R adjacent the right diffusion 104, and a left "bit" 114L above the left diffusion 106. A gate structure 120, such as polysilicon, is disposed on the top oxide layer 116.

The following materials, processes and dimensions may be exemplary (note that the drawing is not "to scale"):

The substrate 102 may be a P-type silicon substrate, or a "P-well" (as illustrated) which is formed in an N-type or P-type silicon substrate.

The first and second diffusions 104 and 106 may both be doped N+, and either may serve as source (S) or drain (D), depending on operating conditions. Generally, the memory cell has left-right (as viewed) "mirror symmetry".

The channel 108 may have a length (Leff, across the page, as viewed) of approximately 100 nm. (This dimension (Leff) depends on the "technology node", currently 100 nm, which is becoming smaller and smaller).

The ONO stack 110 may have a length dimension (Ld, "length drawn", across the page, as viewed) of approximately 120-150 nm, which is greater than the channel length (Leff). (This dimension (Ld) depends on the technology node.)

The channel 108 and the ONO stack 110 may both have a dimension, into the page (as viewed) of Wd (width drawn), typically slightly less than Leff, but may be slightly greater than Leff. This dimension generally depends on the process flow.

The bottom oxide layer 112 may comprise $SiO_2$, formed by oxidation, and may have a thickness of from 3.0 to 6.0 nm, for example (but not limited to) 4.0 mm.

The storage nitride layer 114 may comprise $Si_3N_4$, deposited by a CVD, such as LPCVD, and may have a thickness of from 3.0 to 8.0 nm, for example (but not limited to) 4.0 nm.

The top oxide layer 116 may comprise $SiO_2$, formed by nitride oxidation followed by oxide deposition, and may have a thickness of from 5.0 to 15.0 nm, for example (but not limited to) 10.0 nm.

The gate 120 may be doped N+.

Modes of NROM Operation

Voltages Vd and Vs, Vg and Vsub (or Vb) may be applied to each of the right and left diffusions 106 and 104, the gate 120 and the substrate 102, respectively, for operating the NROM cell. As will be noted, the left and right diffusions 104 and 106 may function as either source or drain, depending on the mode of operation.

For example to program the right bit 114R by channel hot electron (CHE) injection, the left diffusion 106 (acting as source, Vs) may be set to 0 volts (in an array, Vs may be set to between 0 volts and +0.7 volts), the right diffusion 104 (acting as drain, Vd) may be set to +5 volts, the gate 120 (Vg) may be set to +8-10 volts, and the substrate 102 (Vb, Vsub) may be set to 0 volts And, to program the left bit 114L, Vs and Vd would be interchanged.

For example, to erase the right bit 114R, by hot hole injection (HHI), the left diffusion 106 (acting as source, Vs) may be set to float (in an array, Vs may be set to between 0 volts and +4.5 volts), the right diffusion 104 (acting as drain, Vd) may be set to +5 volts, the gate 120 (Vg) may be set to −7 volts, and the substrate 102 (Vb, Vsub) may be set to 0 volts.

And, to erase the left bit 114L, Vs and Vd would be interchanged.

For example, to read the right bit 114R, using "reverse read", the right diffusion 104 (acting as source, Vs) is set to 0 volts
the left diffusion 106 (acting as drain, Vd) is set to +2 volts
the gate 120 (Vg) is set to +5 volts, and
the substrate 102 (Vb, Vsub) is set to 0 volts.

And, to read the left bit 114L, Vs and Vd would be interchanged.

Commonly-owned US2007/0159880 and US 2007/0195607 disclose methods of operating NROM devices including programming and erasing, such as by Fowler Nordheim (−FN) electron tunneling from the top (gate), Hot Hole Injection (HHI) from the bottom (channel), Channel Hot Electron (CHE) injection from the bottom (channel), and Channel-Initiated Secondary Electron (CHISEL) injection from the bottom.

BE-SONOS

A structure which is similar to an NROM cell is a SONOS (silicon-oxide-nitride-oxide-silicon) cell, which also has an ONO stack disposed between the substrate and the gate structure (polysilicon).

FIG. 2A shows the structure of a BE (bandgap engineered) SONOS with ONO tunneling dielectric at the top, such as described in the article *A Novel Gate-Injection Program/Erase P-Channel NAND-Type Flash Memory with High (10M Cycle Endurance)*, Hang-Ting Lue et al., Macronix International Co. Ltd., 2007 Symposium on VLSI Technology Digest of Papers, 978-4-900784-03-1, pp 140-141, incorporated in its entirety by reference herein.

Programming is performed by −FN electron injection from the poly gate (from the top). The device is erased by +FN hole injection, also from the poly gate (from the top). ("FN" is an abbreviation for Fowler-Nordheim.)

The following table lists typical device parameters for the gate-injection BE-SONOS device.

| Tunneling Oxide (O3) | 1.3 nm |
| Inter Nitride (N2) | 2.1 nm |
| Inter Oxide (O2) | 1.7 nm |
| Trapping Nitride (N1) | 8.0 nm |
| Bottom Oxide (O1) | 6.0 nm |

FIG. 2B shows the structure of a BE (bandgap engineered) SONOS with ONO tunneling dielectric at the bottom, such as described in the article *BE-SONOS: A Bandgap Engineered SONOS with Excellent Performance and Reliability*, Hang-Ting Lue et al., Macronix International Co. Ltd., © 2005, IEEE 0-7803-9269-8/05, incorporated in its entirety by reference herein.

For NOR, programming is performed by CHE (from the bottom) and is erased by −FN hole injection from the channel (from the bottom). For NAND programming is performed by +FN electron injection from the channel (from the bottom) and is erased by −FN hole injection from the channel (from the bottom)

The following table lists typical device parameters for the bottom-injection BE-SONOS device.

| Blocking Oxide (O3) | 9.0 nm |
| Trapping Nitride (N2) | 7.0 nm |
| Inter Oxide (O2) | 1.8 nm* |
| Inter Nitride (N1) | 2.0 nm |
| Bottom Oxide (O1) | 1.5 nm |

*The Inter Oxide (O2) may be 2.5 nm, see Reliability Model of Bandgap Engineered SONOS (BE-SONOS), Lue et al., MXIC IEDM, IEEE, 2006, incorporated in its entirety by reference herein.

NROM cells may typically use Hot Hole Injection (HHI) for erase, and channel hot electron (CHE) or channel-initiated secondary electron (CHISEL) injection for program. Recently, the reliability of the NROM was investigated and a new unified retention theory was proposed to explain the retention after cycling characteristics. It was suggested that lateral charge redistribution inside the nitride layer and hot carrier induced interface states formation coexist. Additionally, Hot Hole Injection was considered as a main interface states formation mechanism. See Shapira et al., Unified Retention Model for localized charge-trapping nonvolatile memory device, Appl. Phys. Lett. 92, 133514 (2008), incorporated in its entirety by reference herein.

A possible alternative to avoid Hot Hole Injection is to use Hole tunneling mechanism for erase, however usually top and bottom injectors are designed to be as efficient as possible in the erase. Therefore the oxide layer between the injector nitride and the storage nitride is as thin as possible, such as 1.5 nm-2.5 nm. Due to this thin oxide, retention of charges in those cells may be poor.

Commonly-owned patents disclose structure and operation of NROM and related ONO memory cells. Some examples may be found in commonly-owned U.S. Pat. Nos. 5,768,192 and 6,011,725, 6,649,972 and 6,552,387.

Commonly-owned patents disclose architectural aspects of an NROM and related ONO array, (some of which have application to other types of NVM array) such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array or the like. Some examples may be found in commonly-owned U.S. Pat. Nos. 6,233,180, and 6,448,750. See also commonly-owned U.S. Pat. No. 7,062,619.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer.

Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM. Some examples may be found in commonly-owned U.S. Pat. Nos. 6,954,393 and 6,967,896.

Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon), SANOS (Silicon-Aluminum Oxide-Nitride-Oxide-Silicon), MANOS (Metal-Aluminum Oxide-Nitride-Oxide-Silicon), and TANOS (Tantalum-Aluminum Oxide-Nitride-Oxide-Silicon), and the like used for NVM devices. Further description of NVM and related technologies may be found at "Non Volatile Memory Technology", Vol. 1 & 2 (2005), Vol. 3 (2006) and Vol. 4 (2007), published by Saifun Semiconductor; "Microchip Fabrication", by Peter Van Zant, $5^{th}$ Edition 2004; "Application-Specific Integrated Circuits" by Michael John Sebastian Smith, 1997; "Semiconductor and Electronic Devices", by Adir Bar-Lev, $2^{nd}$ Edition, 1999; "Digital Integrated Circuits" by Jan M. Rabaey, Anantha Chandrakasan and Borivoje Nikolic, $2^{nd}$ Edition, 2002 and materials presented at and through http://siliconnexus.com, "Design Considerations in Scaled SONOS Nonvolatile Memory Devices" found at: http://klabs.org/richcontent/MemoryContent/nvmt_symp/nvmts_2000/presentations/bu_white_sonos_lehigh_univ.pdf, "SONOS Nonvolatile Semiconductor Memories for Space and Military Applications" found at: http://klabs.org/richcontent/MemoryContent/nvmt_symp/nvmts_2000/papers/adams_d.pdf, "Philips Research-Technologies-Embedded Nonvolatile Memories" found at: http://www.research.philips.com/technologies/ics/nvmemories/index.html, and "Semiconductor Memory: Non-Volatile Memory (NVM)" found at:
http://www.ece.nus.edu.sg/stfpage/elezhucx/myweb/NVM.pdf,
all of which are incorporated by reference herein in their entirety.

BRIEF DESCRIPTION

Summary

This summary section of the patent application is intended to provide an overview of the subject matter disclosed herein, in a form lengthier than an "abstract", and should not be construed as limiting the invention to any features described in this summary section.

An NROM cell has an ONO (oxide-nitride-oxide) "charge-trapping" stack with a nitride (N) charge-trapping layer, which is insulated by oxide (O) on both sides (top and bottom). In the main hereinafter, NROM will be discussed as an exemplary oxide-nitride NVM technology, but it should be clearly understood that the teachings disclosed herein may apply to other oxide-nitride ("ON") NVM technologies such as SANOS and TANOS which use a different oxide-based insulator (such as aluminum oxide) on one side of the nitride charge-trapping layer, and oxide on the other side. The charge-trapping stacks of SANOS and TANOS are oxide-nitride-aluminum oxide.

According to the disclosure, generally, retention of charges in a nonvolatile memory (NVM) cell having a nitride-based injector (such as SiN, SIRN, SiON) for facilitating injection of holes into a charge-storage layer (for NROM, nitride) of a charge-storage stack (for NROM, ONO) may be improved by ensuring that an insulating layer (for NROM, oxide) between the charge-storage layer and the injector has a thickness of at least 3 nm. Top and bottom injectors are disclosed. Methods of operating NVM cells are disclosed. The NVM cell may be NROM, SONOS, or other oxide-nitride technology NVM cells such as SANOS, MANOS, TANOS.

According to an embodiment of the disclosure, a nonvolatile memory (NVM) cell may comprise: a semiconductor substrate; a channel disposed between two diffusions in the substrate; a charge-storage stack disposed on the channel and comprising a bottom insulating layer, a charge-storage layer disposed on the bottom oxide layer, and a top insulating layer disposed on the charge-storage layer; an injector layer disposed on the charge-storage stack; a layer of oxide disposed on the injector layer; and a gate disposed on the tunneling layer; wherein the top insulating layer has a thickness of at least 3 nm. Such a "top injector" may comprise a layer of "tunneling" oxide over one or more layers of nitride-based material disposed above the charge-storage stack. The nitride-based material may be selected from the group consisting of nitride, silicon-rich nitride and oxinitride.

According to an embodiment of the disclosure, a nonvolatile memory (NVM) cell may comprise: a semiconductor substrate; a channel disposed between two diffusions in the substrate; a charge-storage stack disposed above the channel and comprising a bottom insulating layer, a charge-storage layer disposed on the bottom oxide layer, and a top insulating layer disposed on the charge-storage layer; a gate disposed on the top insulating layer; a layer of oxide disposed on the substrate; and an injector layer disposed on the layer of oxide; wherein the bottom insulating layer has a thickness of at least 3 nm. Such a "bottom injector" may comprise a layer of "tunneling" oxide under one or more layers of nitride-based material disposed beneath the charge-storage stack. The nitride-based material may be selected from the group consisting of nitride, silicon-rich nitride and oxinitride.

The nitride-based material may be sufficiently conductive to be able to substantially shed any charges trapped therein, within a time of a delay interval between an erase pulse and the erase verify operation, such as silicon-rich nitride (SiRN).

The overall injector may comprise the tunneling oxide layer, followed by a nitride-based layer such as silicon nitride (SiN) or silicon-rich nitride (SiRN), followed by a layer of oxinitride next to the charge-storage stack.

The substrate may comprise silicon; and the gate may comprise poly-silicon. The gate may be heavily P+ doped.

The NVM cell may comprise an NROM cell; and the charge-storage stack may comprise an ONO stack.

According to an embodiment of the disclosure, a method of operating a non-volatile memory (NVM) cell having a substrate, a charge-storage stack and a gate, may comprise: programming using electron injection from the substrate; and erasing using hole tunneling from the gate. The electron injection may be selected from the group consisting of channel hot electron (CHE) injection and channel initiated secondary electron (CHISEL) injection. An injector may be provided between the charge-storage stack and the gate of the NVM cell. Erase may be performed by iterative applications of an erase pulse, followed by a delay, followed by an erase verify operation.

The techniques disclosed herein may be applicable to most NVM devices including, but not limited to, charge-trapping devices such as NROM (sometimes referred to as Nitride Read Only Memory), SONOS (Semiconductor Oxide Nitride Oxide Semiconductor; Silicon-Oxide-Nitride-Oxide-Silicon), SANOS (Silicon-Aluminum Oxide-Nitride-Oxide-Silicon), MANOS (Metal-Aluminum Oxide-Nitride-Oxide-Silicon), and TANOS (Tantalum-Aluminum Oxide-Nitride-Oxide-Silicon), and also to Floating Gate (FG) devices.

According to some embodiments of the present invention, there is provided a nonvolatile memory (NVM) cell including a charge-storage stack with a charge-storage layer, a channel and a gate. According to some embodiments of the present invention, either the channel or the gate may act as a hole source, which holes may be used as part of an erasing step of the NVM cell. An injector or hole injector may be disposed between the charge-storage stack a hole source. According to some embodiments of the present invention, the stack may include a top insulator layer and/or a bottom insulator layer. The top and/or bottom insulator layers may be part of the stack's interface.

According to some embodiments of the present invention, the injector may include or be coated with an insulator layer between the injector and the hole source. The injector insulator may be composed of an oxide and may be 3 nm or thicker. According to further embodiments of the present invention, the injector may be composed of a hole permissive layer, which hole permissive material may have a potential barrier for holes which is relatively lower than that of an interface of said charge-storage stack. The injector may comprise a layer of material having a valence band energy which is higher than that of an insulator layer of the charge-storage stack. The injector may be composed of a material selected from the group consisting of silicon-nitride (SiN), oxinitride (SiON), and silicon-rich nitride (SiRN).

According to some embodiments of the present invention, the charge storage/trapping layer of the stack may be composed of charge trapping type material such as silicon nitride. The NVM cell may be of a type selected from the group consisting of NROM, SONOS and TONOS. The injector may be disposed between the stack and the gate. Alternatively, the injector may be disposed between the stack and the channel.

According to some embodiments of the present invention, the injector may be composed of a hole permissive layer of gradated hole barrier material, which gradated hole barrier material has increasing hole-barrier properties moving away from the hole source. The gradated hole barrier material may be composed of at least two layers of dielectric materials arranged such that a potential barrier height peak for holes is near an interface between the injector and the stack.

According to some embodiments of the present invention, the injector may be composed of at least one layer of a hole permissive material having a potential barrier for holes which is lower than that of an interface of the charge storage stack. The hole permissive material may include a first layer of material disposed next to the hole source and having a first potential barrier for holes which is lower than that of an insulating layer of the charge storage stack. The hole permissive material may also include a second layer of material disposed between the first layer of material and the insulating layer of the charge storage stack and having a second potential barrier for holes which is lower than that of said insulating layer of the charge storage stack and higher than that of said first layer of material. The first layer of material may be selected from the group consisting of nitride (SiN) and silicon-rich nitride (SiRN). The second layer of material may be oxinitride (SiON).

According to some embodiments of the present invention the NVM cell may be programmed using electron injection and erased using hole tunneling from a hole source, which hole source may either be the gate or the channel. Erasing may be performed by applying a potential difference of 14-18 volts between the gate and the substrate. Erasing may be performed by applying approximately +10 volts to the gate and by applying approximately −8 volts to the substrate. Alternatively, erasing may be performed by applying approximately +10 volts to the substrate and by applying approximately −8 volts to the gate. Electron injection may be performed using a technique selected from the group consisting of channel hot electron (CHE) injection and channel initiated secondary electron (CHISEL) injection. Hole tunneling may be performed through an injector between the charge-storage stack and the hole source of the NVM cell.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

band diagram In solid-state physics of semiconductors, a band diagram is a diagram showing the variation in the valence band and conduction band edges versus some spatial dimension, often denoted x. The Fermi level is also usually indicated in the diagram. Sometimes the intrinsic Fermi energy, Ei, which is the Fermi level in the absence of doping, may be shown also. The work function and electron affinity are shown on some diagrams as well. These diagrams are useful in explaining the operation of many kinds of semiconductor devices.

bit The word "bit" is a shortening of the words "binary digit." A bit refers to a digit in the binary numeral system (base 2). A given bit is either a binary "1" or "0". For example, the number 1001011 is 7 bits long. That is the "mathematical" definition of "bit". In some cases, the actual (physical) left and right charge storage areas of a NROM cell are referred to as the left "bit" and the right "bit", even though they may store more than one binary bit (with MLC, each storage area can store at least two binary bits).

cell the term "cell" may be used to describe anything, such as a NVM cell, that can store one unit of analog data. This includes FG memory cells, and non-FG memory cells, such as NROM. See half cell.

cell well (CW) the cell well is an area in the silicon substrate that is prepared for functioning as a transistor or memory cell device by doping with an electron acceptor material such as boron or indium (p, electron acceptors or holes) or with an electron donor material such as phosphorous or arsenic (m, electron donors). The depth of a cell well is defined by the depth of the dopant distribution.

CHE short for channel hot electron. CHE is an "injection mechanism" for injecting electrons into a charge storage area of an NVM memory cell.

CHEI short for channel hot electron injection, sometimes abbreviated "CHE".

CHISEL short for channel initiated secondary electron. See CHE.

CMOS short for complementary metal oxide semiconductor (or silicon). CMOS consists of n-channel and p-channel MOS transistors.

CVD short for chemical vapor deposition. CVD is a chemical process used to produce high-purity, high-performance solid materials. The process is often used in the semiconductor industry to produce thin films. In a typical CVD process, the wafer (substrate) is exposed to one or more volatile precursors, which react and/or decompose on the substrate surface to produce the desired deposit. CVD is used to deposit materials in various forms, including: monocrystalline, polycrystalline, amorphous, and epitaxial. These materials include: silicon, oxide, nitride and metals, such as are commonly used in semiconductor fabrication.

deposition Deposition generally refers to the process of applying a material over another material (or the substrate).

dielectric A dielectric is a non-conducting material or substance. (A dielectric is an electrical insulator.) Some dielectrics commonly used in semiconductor technology are $SiO_2$ ("oxide") and Si3N4 ("nitride"). The insulating quality of a dielectric may be characterized by "k", the dielectric constant. Generally, the higher the "k", the better the insulating quality of the dielectric. Oxide, for example, has a k of approximately 3.9. A class of materials, referred to as "high-k" (or "high-K") dielectrics, have a dielectric constant higher than that of oxide (k>3.9).

dielectric constant The relative dielectric constant of a material under given conditions is a measure of the extent to which it concentrates electrostatic lines of flux. Usually abbreviated "k", dielectric constant is the ratio of the amount of stored electrical energy when a potential is applied, relative to the permittivity of a vacuum. It is also called relative permittivity.

doping doping is the process of introducing impurities (dopants) into the semiconductor substrate, or elements formed on the semiconductor substrate, and is often performed with a mask (or previously-formed elements in place) so that only certain areas of the substrate will be doped. For example, doping is used to form the source and drain regions of an FET. Usually in doping, a dopant, a dosage and an energy level are specified. For example, to form p-type regions, Boron can be implanted as a dose of between about $1E15/cm^2$ and about $5E15/cm^2$ at an energy level of between about 15 keV and about 150 keV to achieve a desired doping profile. An ion implanter is typically employed for the actual implantation. An inert carrier gas such as nitrogen is usually used to bring in the impurity source.

FET short for field effect transistor. The FET is a transistor that relies on an electric field to control the shape and hence the conductivity of a "channel" in a semiconductor material. FETs are sometimes used as voltage-controlled resistors. The terminals of FETs are called gate (G), drain (D) and source (S).

FN tunneling Field emission—also called Fowler-Nordheim tunneling—is the process whereby electrons (or holes) tunnel through a barrier in the presence of a high electric field. This quantum mechanical tunneling process is an important mechanism for thin barriers such as those in metal-semiconductor junctions on highly-doped semiconductors.

half cell "half cell" (or "half-cell") is a term which is sometimes used to refer to the two distinct charge storage areas (left and right "bits", or left and right "sides") of an NROM memory cell.

HHI short for hot hole injection. HHI is an "injection mechanism" for injecting holes into a charge storage area of an NVM memory cell. See CHE.

MLC short for multi-level cell. In the context of a floating gate (FG) memory cell, MLC means that at least two bits of information can be stored in the memory cell. In the context of an NROM memory cell, MLC means that at least four bits of information can be stored in the memory cell—at least two bits in each of the two charge storage areas (or half cells).

MOSFET short for metal oxide semiconductor (or silicon) field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

nitride commonly used to refer to silicon nitride (chemical formula $Si_3N_4$). A dielectric material commonly used in integrated circuit manufacturing. Forms an excellent mask (barrier) against oxidation of silicon (Si). Nitride is commonly used as a hard mask or, in the case of an NVM memory cell having an ONO layer, as a charge-trapping material. Silicon nitride may be abbreviated "SiN" or simply "N". "Silicon Rich" nitride, abbreviated "SiRN" or "SRN" refers to nitride, with increased Si content in the dielectric, such as $Si_7N_8$.

n-type semiconductor in which concentration of electrons is higher than the concentration of "holes". See p-type.

NROM short for nitride(d) read only memory. Generally, a FET-type device having a charge trapping medium such as a nitride layer for storing charges (electrons and holes) in two discrete areas, near the source and drain diffusions, respectively.

NVM short for non-volatile memory. NVM is computer memory that can retain the stored information even when not powered. Examples of non-volatile memory include read-only memory, flash memory, most types of magnetic computer storage devices (for example hard disks, floppy disk drives, and magnetic tape), optical disc drives, and early computer storage methods such as paper tape and punch cards. NVM includes floating gate (FG) devices and NROM devices, as well as devices using optical, magnetic and phase change properties of materials.

ONO short for oxide-nitride-oxide. ONO is used as a charge storage insulator consisting of a sandwich of thermally insulating oxide, and charge-trapping (or charge-storage) nitride.

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films may be obtained by thermal oxidation of silicon.

oxinitride Oxinitride (or oxynitride) refers to silicon OxiNitride (chemical formula $SiO_xN_y$, or simply SiON). Oxinitride is a mixture of silicon oxide and silicon nitride phase.

poly short for polycrystalline silicon (Si), or "poly-Si". Heavily doped poly-Si is commonly used as a gate contact in silicon MOS and CMOS devices;

p-type semiconductor in which concentration of "holes" is higher than the concentration of electrons. See n-type. Examples of p-type silicon include silicon doped (enhanced) with boron (B), Indium (In) and the like. See n-type.

program a method to program a bit in an array, by applying a voltage scheme that injects electrons. This method causes an increase in the Vt of the bit that is being programmed. Alternatively, with "high Vt erase", programming may be a lowering of the Vt of the memory cell. See erase and read. Program may sometimes, erroneously be referred to as "write". See write.

read a method to read the digital data stored in the array. The read operation is usually performed in "blocks" of several cells. See erase and program.

retention Retention generally refers to the ability of a memory cell to retain charges inserted into the charge storage medium, such as a floating gate. The data retention of EPROM, EAROM, EEPROM, and Flash may be limited by charge leaking from the floating gates of the memory cell transistors. Leakage is exacerbated at high temperatures, by high applied voltages or in high-radiation environments.

SLC short for single level cell. In the context of a floating gate (FG) memory cell, SLC means that one bit of information can be stored in the memory cell. In the context of an NROM memory cell, SLC means that at least two bits of information can be stored in the memory cell. See MLC.

SONOS short for Si-Oxide-Nitride-Oxide-Si, another way to describe ONO with the Si substrate underneath and the Poly-Si gate on top.

substrate typically a wafer, of monocrystalline silicon. A substrate is often covered by an oxide layer (sometimes referred to as a "pad oxide layer"). Pad oxide is usually relatively thin, e.g., in the range of about 50 to about 500 Angstroms (5-50 nm), and can be formed, for example, by thermal oxidation of the substrate.

TEHH short for Tunnel Enhanced Hot Hole injection. TEHH is an "injection mechanism". Also referred to as "band to band tunnel assisted hot hole injection".

verify a read operation after applying a program or erase pulse, that checks if the applied program or erase pulse moved the Vt to the target level (program-verify or erase-verify level)

BRIEF DESCRIPTION OF THE DRAWING(S)

Reference will be made in detail to embodiments of the disclosure, examples of which may be illustrated in the accompanying drawing figures (FIGs). The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199a, 199b, 199c, etc. Such relationships, if any, between similar elements in the same or different figures will become apparent throughout the specification, including, if applicable, in the claims and abstract.

FIG. 5 is a cross-sectional view of an NROM cell, according to an embodiment of the disclosure.

FIG. 6 is a cross-sectional view of an NROM cell, according to an embodiment of the disclosure.

FIG. 7 is a cross-sectional view of an NROM cell, according to an embodiment of the disclosure.

FIG. 8 is a cross-sectional view of an NROM cell, according to an embodiment of the disclosure.

DETAILED DESCRIPTION

Figure 1:
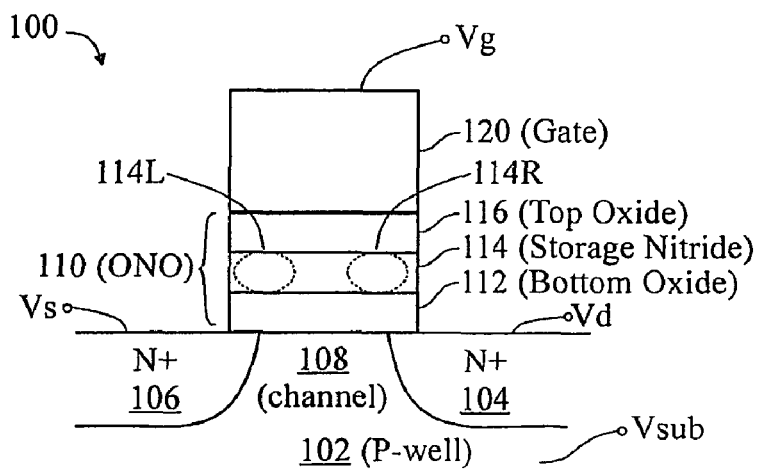
FIG. 1 is a cross-sectional view, partially exploded, of an NROM cell of the prior art.

In the following description, various aspects of techniques related to the structure and operation of nitride read only memory (NROM) and other oxide-nitride technology NVM cells such as ONO (oxide-nitride-oxide) cells will be described. For the purpose of explanation, specific configurations and details are set forth in order to provide a thorough understanding of the techniques. However, it will also be apparent to one skilled in the art that the techniques may be practiced without specific details being presented herein. Furthermore, well-known features may be omitted or simplified in order not to obscure the description(s) of the techniques.

Throughout the descriptions set forth in this disclosure, lowercase numbers or letters may be used, instead of subscripts. For example Vg could be written $V_g$. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "$V_s$" (source voltage) or "$H_2O$" (water). For consistency of font size, such acronyms may be written in regular font, without subscripting, using uppercase and lowercase—for example "Vs" and "H2O". Superscripts may be designated using a carat—for example, $2^{30}$ may be written as "2^30". When powers of 10 are involved, the following notation may be used—for example, "2e13" means $2\times10^{13}$.

Acronyms or abbreviations may be pluralized by adding an "s" at the end, either with or without an apostrophe—for example "Esecs" or "Esec's", both being a plural form of the singular "Esec".

Although various features of the disclosure may be described in the context of a single embodiment, the features may also be provided separately or in any suitable combination. Conversely, although the disclosure may be described herein in the context of separate embodiments for clarity, the disclosure may also be implemented in a single embodiment. Furthermore, it should be understood that the disclosure can be carried out or practiced in various ways, and that the disclosure can be implemented in embodiments other than the exemplary ones described herein below. The descriptions, examples, methods and materials presented in the in the description, as well as in the claims, should not be construed as limiting, but rather as illustrative.

Terms for indicating relative direction or location, such as "up" and "down", "top" and "bottom", and the like may also be used, without limitation.

Improved Retention in NVM Cells with Top/Bottom Injectors

NROM cells may typically use Hot Hole Injection (HHI) for erase, and channel hot electron (CHE) or channel-initiated secondary electron (CHISEL) injection for program. It is a general object of this disclosure is to replace the HHI erase mechanism with a hole injection into the nitride storage in a uniform way, using a tunnelling mechanism, which may manifest itself across the entire charge-storage layer, not only at the edges next to junctions (diffusions).

Recently, the reliability of the NROM was investigated and a new unified retention theory was proposed to explain the retention after cycling characteristics. It was suggested that lateral charge redistribution inside the nitride layer and hot carrier induced interface states formation coexist. See Shapira et al., Unified Retention Model for localized charge-trapping nonvolatile memory device, Appl. Phys, Lett. 92, 133514 (2008), incorporated in its entirety by reference herein.

According to the disclosure, generally, in an NROM cell or other NVM cell having a nitride storage layer (such as SONOS, TANOS, MANOS, and the like), an erase operation may be performed by hole tunneling using an injector having one layer or multiple layers.

In some top injector embodiments, the injector is disposed between the storage stack (ONO in the case of an NROM cell) and the poly (poly-silicon) gate, and holes are injected into the storage nitride from the poly gate. In some bottom injector embodiments, the injector is disposed between the storage stack (ONO in the case of an NROM cell) and the silicon substrate (or channel), and holes are injected into the storage nitride from the substrate.

Figure 2A:
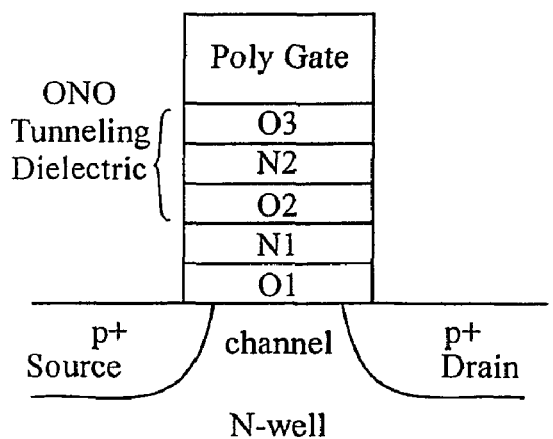
FIG. 2A is a cross-sectional view of a BE-SONOS cell of the prior art.
Figure 2B:
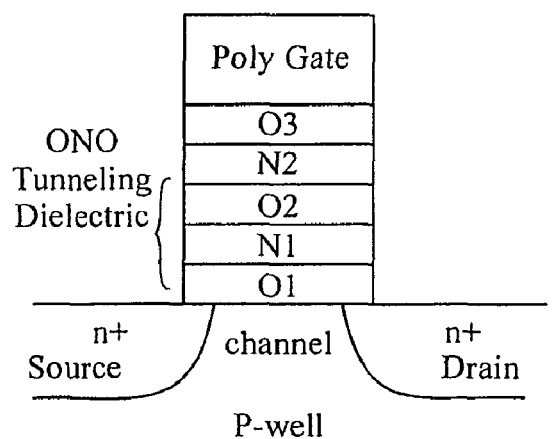
FIG. 2B is a cross-sectional view of a BE-SONOS cell of the prior art.

Known top and bottom injectors, such as the BE-SONOS devices shown in FIGS. 2A and 2B, are designed to be as efficient as possible in the erase. Therefore the oxide layer ("inter-oxide", or "O2") between the injector nitride (N2 for the top injector of FIG. 2A; N1 for the bottom injector of FIG. 2B) and the storage nitride (N1 for top injector of FIG. 2A; N2 for bottom injector of FIG. 2B) is as thin as possible, such as 1.5 nm-2.5 nm. Due to this thin oxide, retention of charges (or simply "retention") in those cells may be poor, as a result of electric charge from the storage nitride migrating through the thin inter-oxide layer to the injector nitride.

According to an aspect of this disclosure, in nitride-layer storage (charge-trapping) devices having a nitride-based injector, an inter-oxide layer (between the storage nitride and injector nitride layer(s)) has a thickness of at least 3 nm.

Figure 3:
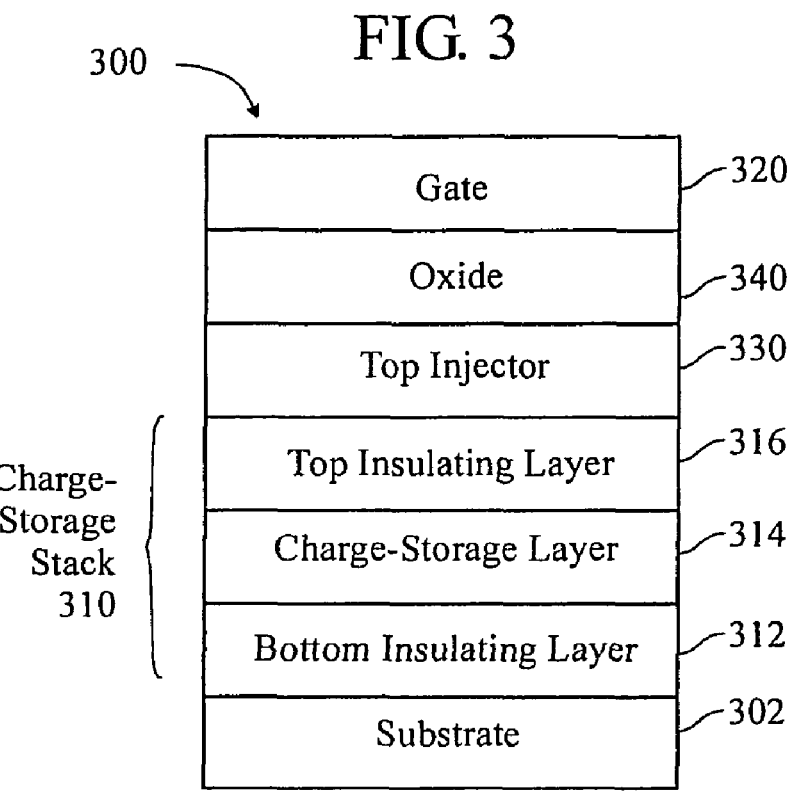
FIG. 3 is a cross-sectional view of an NVM cell with a top injector, according to an embodiment of the disclosure.
Figure 4:
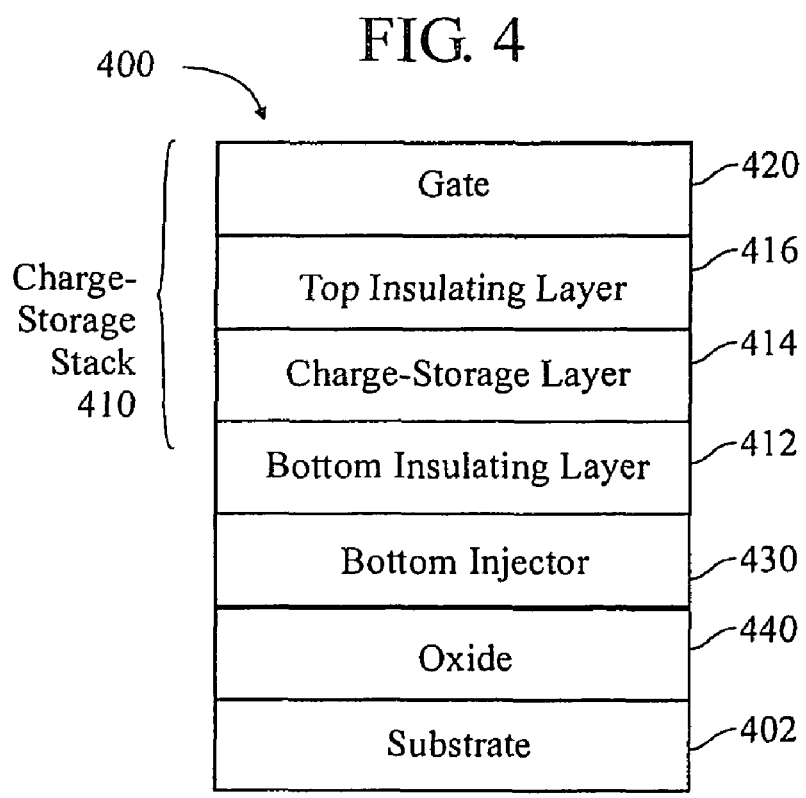
FIG. 4 is a cross-sectional view of an NVM cell with a bottom injector, according to an embodiment of the disclosure.

FIG. 3 illustrates an NVM cell with a top injector for top (from the gate) injection of holes into the charge-storage layer, and FIG. 4 illustrates an NVM cell with a bottom injector for bottom (from the substrate) injection of holes into the charge-storage layer. In both instances, electrons may be injected into the charge-storage layer from the bottom (from the substrate, or channel) for performing a program operation. The various layers shown in these figures (and others) are drawn not-to-scale.

FIG. 3 illustrates an NVM cell 300 having a charge-storage stack 310 (compare 110) disposed on a substrate 302 (compare 102), an injector layer 330 disposed on top of the charge-storage stack 310, and an oxide layer 340 disposed between the injector layer 330 and the gate electrode (or "gate") 320 (compare 120). Since the injector layer 330 is disposed above, or on top (gate side) of the charge-storage stack, it is referred to a "top" injector.

The charge-storage stack 310 may be disposed on a channel (see for example FIG. 1, channel 108) in the substrate 302, and the channel may be disposed between two diffusions (see for example FIG. 1, diffusions 104 and 106) in the substrate 302. In an NROM cell, the charge-storage stack would be ONO (see for example FIG. 1, ONO stack 110).

The substrate 302 may be silicon and the gate electrode 320 may be poly-silicon. A bottom insulating layer 312 (compare 112) of the charge-storage stack 310 may be oxide ($SiO_2$). A charge-storage layer 314 (compare 114) of the charge-storage stack 310 may be nitride ($Si_3N_4$). A top insulating layer 316 of the charge-storage stack 310 may be oxide ($SiO_2$, in the case of NROM or SONOS, compare 116), or another insulating material (such as $Al_2O_3$, in the case of SANOS, MANOS, TANOS, and the like).

Hole injection may be performed from the top—in other words, from the gate electrode 320 (functioning as "injection source") into the charge-storage layer 314. Since holes injected from the injection source (gate 320) pass through the top insulating layer 316, the top insulating layer 316 may be considered to be part of the overall injector. However, for purposes of this discussion the top insulating layer 316 is considered to be part of the charge-storage stack 310, since this is its conventional role. In any case, the top insulating layer 316 is disposed on the side of the charge-storage layer 314 which is oriented towards the injection source 320 (for top injection, the gate), between the charge-storage layer and the injector layer 330, and may therefore be referred to as "inter-oxide". The oxide layer 340, between the injection source (gate) and the top injector may be considered to be part of the overall injector, and may be referred to as "tunneling oxide".

The top injector layer 330 may comprise one (a single) or more (multiple) layers of a nitride-based material, such as, but not limited to:
- nitride (Si3N4, or SiN)
- silicon-rich nitride (SiRN)
- oxinitride (SiON)

For example, if SiON and SiRN are used in a multi-layer injector, the SiON may be between the SiRN and the storage stack.

Note that the BE-SONOS of FIG. 2A has a structure which is similar to that of the NVM cell with top injector of FIG. 3.

For example, there is a bottom oxide (O1) which is comparable to the bottom insulating layer 312, a trapping nitride (N1) which is comparable to the charge-storage layer 314, an inter-oxide (O2) which is comparable to the top insulating layer 316, an inter-nitride (N2) which is comparable to the top injector layer 330, and a tunneling oxide (O3) which is comparable to the oxide layer 340.

Charges which are stored in the charge-storage layer 314 may escape through the bottom insulating layer 312 to the substrate 302. The bottom insulating layer 312 therefore has a thickness of at least 3 nm.

Charges which are stored in the charge-storage layer 314 may also escape through the top insulating layer 316 to the top injector layer 330. In order to improve (provide for good) retention of charges in the charge-storage layer 314, the top insulating layer 316 therefore has a thickness of at least 3 nm.

In the prior art (the two BE-SONOS structures described hereinabove) it is explained that retention problem is resolved by multi-layer concept, therefore according to the prior art it is allowed not to use thick oxide layer. On the contrary it is explained why thin oxide is better and main retention mechanism is referred to as the direct tunneling. According to the disclosure, the charge loss through the multi-layer injector of thin oxides might be severe since there is a trapping in the injector nitride and it is not a direct tunneling. Therefore, the top oxide is made thick (3 nm for example).

Performing an erase operation by injection of holes into the charge-storage layer 314 may be accomplished using hole direct tunneling, by applying (for example) 14-18 volts between the gate and the substrate (or well) of the NVM cell, for example by applying plus (+) 8-10 volts to the gate, and minus (−) 6-8 volts to the substrate. The gate may be heavily P+ doped poly-Si for better hole supply. Programming of the NVM cell may be performed using channel hot electron (CHE) or channel initiated secondary electron (CHISEL) injection.

It may be noted that the conditions for hole injection from the top (gate) may tend to also cause electron injection from the bottom (substrate). In order to minimize this "side effect", the bottom oxide 312 should be sufficiently thick, such as at least 3 nm, so that the electron back tunnelling will be FN tunnelling. The tunnel oxide on the other hand has to be very thin, such as 1-2 nm, thus hole tunneling will be direct tunneling. The hole tunnelling (from the top) will prevail (dominate) over electron back tunnelling (from the bottom) only in the case that electron tunnelling is FN and hole tunnelling is direct. Therefore, according to the disclosure, the tunnel oxide thickness is reduced, and the bottom oxide thickness is maintained or increased.

FIG. 4 illustrates an NVM cell 400 having a charge-storage stack 410 (compare 110) disposed above a substrate 402 (compare 102), an injector layer 430 disposed below the charge-storage stack 310, and an oxide layer 440 disposed between the injector layer 430 and the substrate 408. Since the injector layer 430 is disposed below, or on the bottom (substrate side) of the charge-storage stack, it is referred to a "bottom" injector.

The charge-storage stack 410 may be disposed above a channel (see for example FIG. 1, channel 108) in the substrate 402, and the channel may be disposed between two diffusions (see for example FIG. 1, diffusions 104 and 106) in the substrate 402. In an NROM cell, the charge-storage stack would be ONO (see for example FIG. 1, ONO stack 110).

The substrate 402 may be silicon and the gate electrode 420 may be poly-silicon. A bottom insulating layer 412 (compare 112) of the charge-storage stack 410 may be oxide ($SiO_2$). A charge-storage layer 414 (compare 114) of the charge-storage stack 410 may be nitride ($Si_3N_4$). A top insulating layer 416 of the charge-storage stack 410 may be oxide ($SiO_2$, in the case of NROM or SONOS, compare 116), or another insulating material (such as $Al_2O_3$, in the case of SANOS, MANOS, TANOS, and the like).

Hole injection may be performed from the bottom—in other words, from the substrate 402 (functioning as "injection source") into the charge-storage layer 414. Since holes injected from the injection source (substrate 402) pass through the bottom insulating layer 412, the bottom insulating layer 412 may be considered to be part of the overall injector. However, for purposes of this discussion the bottom insulating layer 412 is considered to be part of the charge-storage stack 410, since this is its conventional role. In any case, the bottom insulating layer 412 is disposed on the side of the charge-storage layer 414 which is oriented towards the injection source 402 (for bottom injection, the substrate), between the charge-storage layer and the bottom injector layer 430, and may therefore be referred to as "inter-oxide". The oxide layer 440, between the injection source (substrate) and the bottom injector layer 430 may be considered to be part of the overall injector, and may be referred to as "tunneling oxide".

The bottom injector layer 430 may comprise one (a single) or more (multiple) layers of a nitride-based material, such as, but not limited to:

nitride (Si3N4, or SiN)
silicon-rich nitride (SIRN
oxynitride (SiON)

For example, if SiON and SiRN are used in a multi-layer injector, the SiON may be between the SiRN and the storage stack.

Note that the BE-SONOS of FIG. 2B has a structure which is similar to that of the NVM cell with bottom injector of FIG. 4. For example, there is a top oxide (O3) which is comparable to the top insulating layer 416, a trapping nitride (N2) which is comparable to the charge-storage layer 414, an inter-oxide (O2) which is comparable to the bottom insulating layer 412, an inter-nitride (N1) which is comparable to the bottom injector layer 430, and a tunneling oxide (O1) which is comparable to the oxide layer 440.

Charges which are stored in the charge-storage layer 414 may escape through the top insulating layer 416 to the substrate 402. The top insulating layer 416 therefore has a thickness of at least 3 nm.

Charges which are stored in the charge-storage layer 414 may also escape through the bottom insulating layer 412 to the bottom injector layer 430. In order to improve (provide for good) retention of charges in the charge-storage layer 414, the bottom insulating layer 412 therefore has a thickness of at least 3 nm.

In the prior art (the two BE-SONOS structures described hereinabove) it is explained that the retention problem is resolved by a multi-layer concept, therefore according to the prior art it is allowed not use a thick oxide layer. On the contrary it is explained why thin oxide is better and main retention mechanism is referred to as the direct tunneling. According to the disclosure, the charge loss through the multi-layer injector of thin oxides might be severe since there is a trapping in the injector nitride and it is not a direct tunneling. Therefore, the bottom oxide is made thick (3 nm for example).

Performing an erase operation by injection of holes into the charge-storage layer 414 may be accomplished using direct hole tunneling, by applying (for example) (−)14-18 volts between the gate and the substrate (or well) of the NVM cell, for example by applying minus (−) 8-10 volts to the gate, and plus (+) 6-8 volts to the substrate. The gate may be heavily P+ doped poly-Si to suppress the back electron tunneling problem. Programming of the NVM cell may be performed using channel hot electron (CHE) or channel initiated secondary electron (CHISEL) injection.

It may be noted that the conditions for hole injection from the substrate may tend to also cause electron injection from the gate. In order to minimize this "side effect", the top oxide 416 should be sufficiently thick, such as at least 3 nm, so that the electron back tunnelling will be FN tunnelling. The tunnel oxide on the other hand has to be very thin, such as 1-2 nm, thus hole tunnelling will be direct tunnelling. The hole tunnelling (from the bottom) will prevail (dominate) over electron back tunnelling (from the top) only in the case that electron tunnelling is FN and hole tunnelling is direct. Therefore, according to the disclosure, the tunnel oxide thickness is reduced, and the top oxide thickness is maintained or increased.

Regarding the top and bottom injectors described herein, the overall injector (330/340, 430/440) facilitates hole injection into a charge-storage layer (314, 414) of the charge-storage stack (310, 410), from an injection source (gate 320, substrate 408). However, some of these charges may get trapped in the injector layer (330, 430), particularly if the injector layer (330, 430) is nitride-based. This may be a bigger problem with the bottom injector (FIG. 4) since the charge trapped far from the poly gate has a bigger impact.

According to an aspect of the disclosure, silicon rich nitride (SiRN) is exemplary of an injector material that, although it may retain (trap) charges, is sufficiently conductive to be able to substantially shed any charges trapped therein, within the time of a delay interval between an erase pulse and erase verify (read) operation, so as not to skew the verify (read) operation. Generally, charges retained by the injector layer 330 may be shed to the gate 320 through the oxide 340, and charges retained by the injector layer 430 may be shed to the substrate 408 through the oxide 440. Therefore, these injector oxides 340 and 440 should be maintained very thin, such as 1-2 nm.

Embodiments of NROM Cells with Top Injectors and Improved Retention

Four embodiments (#1, #2, #3, #4) of NROM cells with top injector will be described, and are illustrated in FIGS. 5-8. These NROM cells may be referred to as "Gate Erase NROM", and an erase operation using these cells may be referred to as "NVM Top Gate Injection".

Figure 13:
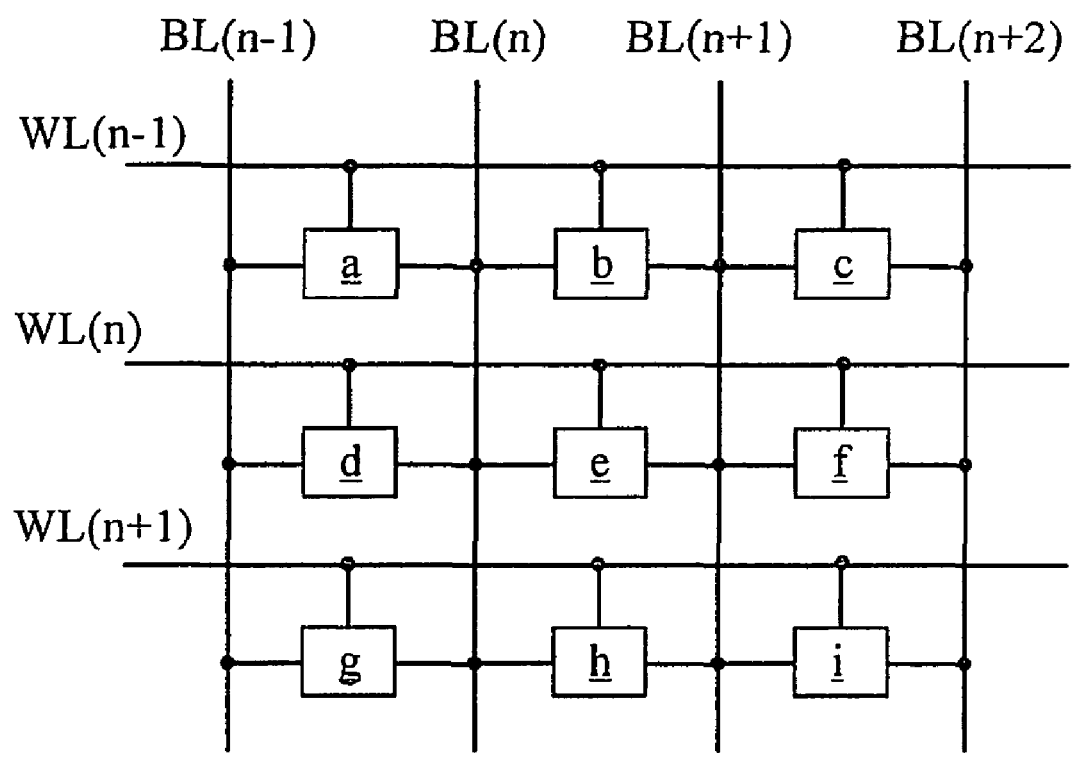
FIG. 13 is a diagram of an array of a plurality (array) of NVM memory cells according to an embodiment of the disclosure.

The techniques described herein and may be applied to other ONO-based NVM cells, such as SONOS. The NROM cells described herein may be used in Flash memory. An array (plurality) of NVM cells is shown in FIG. 13.

Generally, in each of the NROM cells with top injector described herein, the top injector comprises at least one nitride-based injector layer which is disposed (inserted) on top of the ONO stack, between the top oxide layer of the ONO stack and the (poly) gate of an NROM cell. The injector is added to enhance the hole injection, from the gate to the nitride charge-storage layer of the ONO (charge-storage) stack.

The at least one nitride-based injector layer may comprise a layer of conventional nitride (SiN) or silicon-rich nitride (SiRN). Either SiN or SiRN provides a lower potential barrier for holes (than the top oxide layer of the ONO stack), and thereby may increase hole tunneling through to the nitride charge-storage layer of the NROM, thereby enabling an efficient erase operation.

A nitride-based injector such as SiN or SiRN may trap charge, which may adversely affect the overall operation of the NROM cell, such as by biasing measured Vt during an erase verify. (Particularly in NROM cells having two charge-storage areas, incorporating a nitride-based injector that retains charge can alter results during measuring Vt of the cell, or half cell, particularly if the injector performs in a uniform way, across the entire ONO dielectric. In other words, it is not desirable that the injector retain charge.) However, since SiRN is more conductive than SiN, any trapped charge may escape more quickly, such as after an erase pulse, and before the erase verify pulse, thereby minimizing the problem. See, for example, *Nonvolatile Memory Technologies with Emphasis on Flash: A Comprehensive Guide to Understanding and Using Flash Memory Devices*, Edited by Joe E. Brewer, IEEE Press Series on Microelectronic Systems, Wiley 2007 pp 437-438, incorporated in its entirety by reference herein.

The injector may also comprise a layer of oxide disposed atop the nitride-based injector layer. This layer of oxide may be referred to as "tunneling oxide". The tunneling oxide layer should be sufficiently thin that charges which are trapped in the nitride-based injector layer(s) can pass through the tunneling oxide layer to the gate.

The nitride-based injector may additionally (in addition to a layer of SiN or SiRN) comprise a layer of silicon oxinitride (SiON, may also be spelled oxynitride) disposed (inserted) between the SiN or SiRN layer and the top oxide layer of the ONO stack of the NROM cell. (The SiON layer may also be an injector layer.) Generally, the purpose of the SiON layer is to reduce the thickness of the SiN or SiRN layer, thereby reducing charge-trapping within the SiN or SiRN layer of the injector, without adversely affecting hole tunneling efficiency. For example, layers of SiN (or SiRN) and SiON may be inserted between the poly-Si gate and the top oxide layer of the ONO stack of the NROM cell.

When using such a top injector, atop the top oxide layer of the ONO stack, the top oxide layer of the ONO stack may be considered to be part of the injector, although it generally may not be referred to as such, rather referring only to the additional layers on top of the ONO stack as the "injector".

In order to minimize charges which are stored (or trapped) in the nitride charge-storage layer of the ONO stack from "leaking" into the injector, the top oxide layer of the ONO stack may have a thickness of at least 3 nm, thereby providing for good retention of charges in the nitride charge-storage layer of the ONO stack.

The nitride-based injector may be provided in such a way that the good behavior of the NROM cell is maintained substantially intact. For example, adding the top injector on top of the top oxide layer of the ONO stack can alter an electrical (such as dielectric) characteristic of the ONO stack. Therefore, the top oxide layer of the ONO stack may be thinned, to compensate for the addition of the nitride-based injector, in order to try to maintain an electrical characteristic, such as a "dielectric constant—based electrical thickness" of layer(s) atop the storage nitride of the ONO stack substantially the same as in the ONO stack for a conventional NROM cell. However, the top oxide layer of the ONO stack should be at least 3 rum thick, to provide adequate insulation atop the nitride storage layer, and good retention.

The following dielectric constants (k) are exemplary of the materials discussed herein:

| Oxide | SiO2 | k = 3.9 (2.4 to 4.2) |
| Nitride | Si3N4 | k = 7.8 (7.5 to 8.0) |
| Silicon-Rich Nitride | SiRN | k = 7.8 (7.5 to 8.0) |
| Oxynitride | SiON | k = 5.8 (4.2 to 7.5) |

Erase of the NROM cells disclosed herein may be performed by hole tunneling from the gate (from above) through the nitride-based injector, to the nitride charge-storage layer of the ONO stack. Programming of the NROM cells disclosed herein may be performed by conventional electron injection from the channel (from below), such as by using channel hot electron (CHE) or channel-initiated secondary electron (CHISEL) injection. Due to the self-aligned hole-tunneling erase, the mismatch between holes and electrons may be reduced which suppresses the charge redistribution problem. Additionally, Hot Hole Injection, which is considered as a main interface states formation mechanism may be eliminated.

The following table lists typical device parameters for a "standard" NROM cell illustrated in FIG. 1, the gate-injection BE-SONOS device illustrated in FIG. 2A, and typical device parameters for the exemplary gate erase NROM cells illustrated in FIGS. 5-8.

| | FIG. 1 NROM | FIG. 2A BE-SONOS | FIG. 5 Nitride injector | FIG. 6 SiRN injector | FIG. 7 Nitride/SiON injector | FIG. 8 SiRN/SiON injector |
|---|---|---|---|---|---|---|
| Gate | Poly N+ | Poly N | Poly P+ | Poly P+ | Poly P+ | Poly P+ |
| Tunneling Oxide | -none- | 1.3 nm | 1.5 nm (1-2) | 1.5 nm (1-2) | 1.5 nm (1-2) | 1.5 nm (1-2) |
| Nitride-Based Injector Layer | -none- | 2.1 nm | 3 nm (2-5) | 3 nm (2-5) | 3 nm (2-5) | 3 nm (2-5) |
| Oxynitride | -none- | -none- | -none- | -none- | 3 nm (2-5) | 3 nm (2-5) |
| Top Oxide (inter oxide) | 12 nm (5-15) | 1.7 nm | 6.0 nm (≧3) | 6.0 nm (≧3) | 4.0 nm (≧3) | 4.0 nm (≧3) |
| Storage Nitride | 4 nm (3-8) | 8.0 nm | 4 nm (3-8) | 4 nm (3-8) | 4 nm (3-8) | 4 nm (3-8) |
| Bottom Oxide | 4 nm (3-6) | 6.0 nm | 4 nm (3-6) | 4 nm (3-6) | 4 nm (3-6) | 4 nm (3-6) |
| Well | P well | N well | P well | P well | P well | P well |

Note, in the table above, that for the structures with top injectors, the top oxide layer of the ONO stack may be thinned to compensate for electrical effects of the overlying injector, in contrast with the BE-SONOS cell (also, in contrast with the "standard NROM" cell), but the storage nitride and bottom oxide layers of the ONO stack may remain the same as the standard NROM cell.

NROM memory cells may typically be erased using a technique called hot hole injection (HHI), or tunnel enhanced hot hole (TEHH) injection, through the bottom oxide layer of the ONO stack. Some exemplary advantages of the tunneling techniques disclosed herein, as contrasted with HHI or TEHH injection may include:

- scaling and reliability issues and problems are reduced, in comparison with HHI.
- less damage to the bottom oxide layer of the ONO stack.
- Generally, higher voltages but less current may be required to perform erase (as contrasted with HHI).

It should be understood that by applying a high electric field across the NROM cells that are described herein, such as (+) 14V-18V from the gate to the substrate, either electron injection from silicon or hole injection from poly may be achieved. However, it should be understood that, in any structure where there is silicon (or polysilicon) and oxide, the electron injection is much more efficient by tunnelling because the barrier height between silicon (or polysilicon), relative to electron injection is about 3.1 eV-3.2 eV, and for hole injection is about 4.5-4.8 eV. Therefore, electrons may inject more easily, and accounts for previous techniques of performing −FN tunneling from the gate to increase the Vt of the storage nitride layer.

According to the present disclosure, various structures, mechanisms and techniques for performing hole injection, from the gate to decrease the Vt of the charge-storage layer, efficiently and effectively, using tunneling. In conjunction with using hole injection from the top (from the gate) for erase, programming may be performed using conventional electron injection from the bottom (from the substrate, or channel). Although it is possible to reverse the situation and use hole injection from the top (from the gate) for programming, in conjunction with using electron injection from the bottom (from the channel) for erase, in the main hereinafter hole injection is discussed in terms of an erase mechanism. Hole injection may be enhanced to become the dominant mechanism, hence the result will be erase rather than programming.

Embodiment #1

FIG. 5 shows an embodiment of an NROM cell 500 with a top injector. The NROM cell 500 is similar to the NROM cell 100 of FIG. 1, and comprises:

a substrate 502 (compare 102);

two spaced-apart diffusions 504 and 506 (compare 104 and 106);

a channel between 508 (compare 108) disposed in the substrate 502, between the diffusions 504 and 506;

an ONO stack 510 (compare 110) disposed on a surface of the substrate 502, above the channel 508; and a gate 520 (compare 120) disposed above the ONO stack 510.

The ONO stack 510 comprises a bottom oxide layer 512 (compare 112), a storage nitride layer 514 (compare 114), and a top oxide layer 516 (compare 116). The storage nitride layer has a left bit (charge-storage area) 514L (compare 114L) and a right bit (charge-storage area) 514R (compare 114L).

Exemplary approximate dimensions for the layers 512, 514 and 516 of the ONO stack 510 are set forth in the table above (under "FIG. 5 Nitride injector").

Various voltages Vg, Vd, Vs and Vsub which may be applied to the gate 520, diffusions 504 and 506, and substrate (or P-well) 502 are shown, and may be discussed hereinbelow.

The NROM cell 500 further comprises a nitride-based, top injector layer 530 disposed between the ONO stack 510 and the gate 520, more particularly between the top oxide layer 516 of the ONO stack and the gate 520. The nitride-based injector layer 530 may comprise a single layer conventional silicon nitride (SiN), having a stoichiometry of $Si_3N_4$ (3 parts silicon, 4 parts nitrogen), and may have an exemplary thickness of approximately 2-5 nm, such as 3 nm.

The NROM cell 500 further comprises a layer 540 of oxide ($SiO_2$) disposed atop (on) the nitride-based top injector layer 530, between the top injector layer 530 and the gate 520. The oxide layer 540 separates the nitride 530 from the poly gate 520 and therefore may reduce charge-trapping in the injector nitride 530 (there is no direct contact, meaning no charge transport at zero bias between the "source" and the injector). It may be noted, in the BE-SONOS structure in FIG. 2A, there is an oxide layer "O3" between the "N2" tunneling dielectric and the poly gate. This layer 540 may be referred to as "tunneling oxide". In order to allow charge(s) which may be trapped in the injector to escape (to the gate), this layer 540 should be as thin as possible, and may have an exemplary thickness of 1-2 nm, such as 1.5 nm.

In order to compensate for the addition of the nitride-based top injector layer 530, and additional (tunneling) oxide 540, the top oxide layer 516 of the ONO stack 510 may be made thinner than in a conventional (or "standard") NROM (such as 100, FIG. 1). For example, whereas the top oxide layer 116 in a conventional NROM cell may be 12 nm, the top oxide layer 516 in the NROM cell 500 with top injector may have an exemplary thickness of 3-8 nm, such as 6 nm. In any case, it is desirable to maintain the thickness of this oxide layer 516 to be at least 3 nm, for the purpose of providing good retention of charge(s) in the nitride layer 514.

An appropriate thickness for the top oxide layer 516 may be calculated by taking into account the thicknesses and dielectric constants for the additional layers of nitride and oxide above the top oxide layer 516.

For example, since nitride (SiN) has approximately twice the dielectric constant of oxide, 8 nm of nitride has the equivalent dielectric property (or "oxide equivalent" thickness) as 4 nm of oxide. Therefore, to compensate for the addition of the injector layer 530, and maintain an electrical characteristic of the ONO stack comparable to that of a conventional NROM cell (FIG. 1), for every 2 nm of nitride 530 which is added, the top oxide layer 516 may be 1 nm thinner.

To compensate for the additional (tunneling) oxide layer 540, the top oxide layer 516 can be thinned on a 1-to-1 basis. In other words, for every 1 nm of tunneling oxide 540 which is added, the top oxide layer 516 may be 1 nm thinner.

However, the top oxide layer 516 should be at least 3 nm.

The thickness of the nitride storage layer 514 may be approximately 3-8 nm, such as 4 nm, or substantially unchanged from the conventional NROM.

The thickness of the bottom oxide layer 512 may be approximately 3-6 nm, such as 4 nm, or substantially unchanged from the conventional NROM.

To perform erase, by hole tunneling from the gate, the following voltages may be applied:

the gate voltage (Vg) may be approximately +10 v
the diffusion voltages (Vs and Vd) may both be same as substrate or float
the substrate voltage (Vb or Vsub) may be approximately −8 v Notice that both diffusions are biased the same, since the erase operation is for the entire cell (both half cells). The potential difference between gate and substrate (or gate and well, $V_{GW}$) may be approximately 14-18 volts.

The gate 520 may be heavily P+ doped poly-Si to provide a better (than N+) hole supply. For example, boron (B) at a dose of 1e16/$cm^2$ at an energy level of 9 KeV, or BF2 at a dose of 1e16/$cm^2$ at an energy level of 40 KeV.

Programming of the NROM cell 500 may proceed as usual, inserting electrons into the left and right bits (charge-storage areas) 514L and 514R of the charge-storage layer 514, such as with CHE or CHISEL injection mechanisms.

Embodiment #2

FIG. 6 shows an embodiment of an NROM cell 600 with a top injector. The NROM cell 600 is similar to the NROM cell 100 of FIG. 1, and comprises:

a substrate 602 (compare 102);
two spaced-apart diffusions 604 and 606 (compare 104 and 106);
a channel between 608 (compare 108) disposed in the substrate 602, between the diffusions 604 and 606;
an ONO stack 610 (compare 110) disposed on a surface of the substrate 602, above the channel 608; and
a gate 620 (compare 120) disposed above the ONO stack 610.

The ONO stack 610 comprises a bottom oxide layer 612 (compare 112), a storage nitride layer 614 (compare 114), and a top oxide layer 616 (compare 116). The storage nitride layer has a left bit (charge-storage area) 614L (compare 114L) and a right bit (charge-storage area) 614R (compare 114R). Exemplary approximate dimensions for the layers 612, 614 and 616 of the ONO stack 610 are set forth in the table above (under "FIG. 6 SiRN injector").

Various voltages Vg, Vd, Vs and Vsub which may be applied to the gate 620, diffusions 604 and 606, and substrate (or P-well) 602 are shown, and may be discussed hereinbelow.

The NROM cell 600 further comprises a nitride-based, top injector layer 630 disposed between the ONO stack 610 and the gate 620, more particularly between the top oxide layer 616 of the ONO stack and the gate 620. The nitride-based injector layer 630 may comprise a single layer of silicon-rich nitride (SiRN), having a stoichiometry of $Si_xN_y$ (more than 3 parts silicon and/or fewer than 4 parts nitrogen), and may have an exemplary thickness of approximately 2-5 nm, such as 3 nm. A non-limiting example of SiRN is $Si_7N_8$ (7 parts silicon and 8 parts nitrogen).

The NROM cell 600 further comprises a layer 640 of oxide ($SiO_2$) disposed atop (on) the nitride-based top injector layer 630, between the top injector layer 630 and the gate 620. The oxide layer 640 separates the silicon-rich nitride 630 from the poly gate 620 and therefore may reduce charge-trapping in the injector silicon-rich nitride 630 (there is no direct contact, meaning no charge transport at zero bias between the "source" and the injector). It may be noted, in the BE-SONOS structure in FIG. 2A, there is an oxide layer "O3" between the "N2" tunneling dielectric and the poly gate. This layer 640 may be referred to as "tunneling oxide". In order to allow charge(s) which may be trapped in the injector to escape (to the gate), this layer 540 should be as thin as possible, and may have an exemplary thickness of 1-2 nm, such as 1.5 nm.

In order to compensate for the addition of the nitride-based top injector layer 630, and additional (tunneling) oxide 640, the top oxide layer 616 of the ONO stack 610 may be made thinner than in a conventional (or "standard") NROM (such as 100, FIG. 1). For example, whereas the top oxide layer 116 in a conventional NROM cell may be 12 nm, the top oxide layer 616 in the NROM cell 600 with top injector may have an exemplary thickness of 3-8 nm, such as 6 nm. In any case, it is desirable to maintain the thickness of this oxide layer 616 to be at least 3 nm, for the purpose of providing good retention of charge(s) in the nitride layer 614.

An appropriate thickness for the top oxide layer 616 may be calculated by taking into account the thicknesses and dielectric constants for the additional layers of nitride and oxide above the top oxide layer 616.

For example, since silicon-rich nitride (SiRN) has approximately twice the dielectric constant of oxide, 8 nm of silicon-rich nitride has the equivalent dielectric property (or "oxide equivalent" thickness) as 4 nm of oxide. Therefore, to compensate for the addition of the injector layer 530, and maintain an electrical characteristic of the ONO stack comparable to that of a conventional NROM cell (FIG. 1), for every 2 nm of silicon-rich nitride 630 which is added, the top oxide layer 616 may be 1 nm thinner.

To compensate for the additional (tunneling) oxide layer 640, the top oxide layer 616 can be thinned on a 1-to-1 basis. In other words, for every 1 nm of tunneling oxide 640 which is added, the top oxide layer 616 may be 1 nm thinner.

However, the top oxide layer 616 should be at least 3 nm.

The thickness of the nitride storage layer 614 may be approximately 3-8 nm, such as 4 nm, or substantially unchanged from the conventional NROM.

The thickness of the bottom oxide layer 612 may be approximately 3-6 nm, such as 4 nm, or substantially unchanged from the conventional NROM.

To perform erase, by hole tunneling from the gate, the following voltages may be applied:
the gate voltage (Vg) may be approximately +10 v
the diffusion voltages (Vs and Vd) may both be same as substrate or float
the substrate voltage (Vb or Vsub) may be approximately −8 v Notice that both diffusions are biased the same, since the erase operation is for the entire cell (both half cells). The potential difference between gate and substrate (or gate and well, $V_{GW}$) may be approximately 14-18 volts.

The gate 620 may be heavily P+ doped poly-Si to provide a better (than N+) hole supply. For example, boron (B) at a dose of 1e16/cm² at an energy level of 9 KeV, or BF2 at a dose of 1e16/cm² at an energy level of 40 KeV.

Programming of the NROM cell 600 may proceed as usual, inserting electrons into the left and right bits (charge-storage areas) 614L and 614R of the charge-storage layer 614, such as with CHE or CHISEL injection mechanisms.

Embodiment #3

FIG. 7 shows an embodiment of an NROM cell 700 with a top injector. The NROM cell 700 is similar to the NROM cell 100 of FIG. 1, and comprises:
a substrate 702 (compare 102);
two spaced-apart diffusions 704 and 706 (compare 104 and 106);
a channel between 708 (compare 108) disposed in the substrate 702, between the diffusions 704 and 706;
an ONO stack 710 (compare 110) disposed on a surface of the substrate 702, above the channel 708; and
a gate 720 (compare 120) disposed above the ONO stack 710.

The ONO stack 710 comprises a bottom oxide layer 712 (compare 112), a storage nitride layer 714 (compare 114), and a top oxide layer 716 (compare 116). The storage nitride layer has a left bit (charge-storage area) 714L (compare 114L) and a right bit (charge-storage area) 714R (compare 114R). Exemplary approximate dimensions for the layers 712, 714 and 716 of the ONO stack 710 are set forth in the table above (under "FIG. 7 Nitride/SiON injector").

Various voltages Vg, Vd, Vs and Vsub which may be applied to the gate 720, diffusions 704 and 706, and substrate (or P-well) 702 are shown, and may be discussed hereinbelow.

The NROM cell 700 further comprises a nitride-based, top injector layer 730 disposed between the ONO stack 710 and the gate 720, more particularly between the top oxide layer 716 of the ONO stack and the gate 720. The nitride-based injector layer 730 may comprise a single layer conventional silicon nitride (SiN), having a stoichiometry of $Si_3N_4$ (3 parts silicon, 4 parts nitrogen), and may have an exemplary thickness of approximately 2-5 nm, such as 3 nm.

The NROM cell 700 further comprises a layer 740 of oxide ($SiO_2$) disposed atop (on) the nitride-based top injector layer 730, between the top injector layer 730 and the gate 720. The oxide layer 740 separates the nitride 730 from the poly gate 720 and therefore may reduce charge-trapping in the injector nitride 730 (there is no direct contact, meaning no charge transport at zero bias between the "source" and the injector). It may be noted, in the BE-SONOS structure in FIG. 2A, there is an oxide layer "O3" between the "N2" tunneling dielectric and the poly gate. This layer 740 may be referred to as "tunneling oxide". In order to allow charge(s) which may be trapped in the injector to escape (to the gate), this layer 740 should be as thin as possible, and may have an exemplary thickness of 1-2 nm, such as 1.5 nm.

A layer of oxinitride (SiON) 734 may be disposed (inserted) between the layer 730 of silicon nitride (SiN) and the top oxide layer 716 of the ONO stack 710, and may have an exemplary thickness of approximately 2-5 mm, such as 3 nm. The addition of the SiON layer 734 reduces the amount of nitride (SiN) 730 needed, and hence may reduce the amount of charge trapping inside the nitride layer 730, without affecting the hole-tunneling efficiency.

In order to compensate for the addition of the nitride-based top injector layer 730, and additional (tunneling) oxide 740, and the additional SiON layer 734, the top oxide layer 716 of the ONO stack 710 may be made thinner than in a conventional (or "standard") NROM (such as 100, FIG. 1). For example, whereas the top oxide layer 116 in a conventional NROM cell may be 12 nm, the top oxide layer 716 in the NROM cell 700 with top injector may have an exemplary thickness of 3-8 nm, such as 4 nm. In any case, it is desirable to maintain the thickness of this oxide layer 716 to be at least 3 nm, for the purpose of providing good retention of charge(s) in the nitride layer 714.

An appropriate thickness for the top oxide layer 716 may be calculated by taking into account the thicknesses and dielectric constants for the additional layers of nitride and oxide above the top oxide layer 716.

For example, since nitride (SiN) has approximately twice the dielectric constant of oxide, 8 nm of nitride has the equivalent dielectric property (or "oxide equivalent" thickness) as 4 nm of oxide. Therefore, to compensate for the addition of the injector layer 530, and maintain an electrical characteristic of the ONO stack comparable to that of a conventional NROM cell (FIG. 1), for every 2 nm of nitride 730 which is added, the top oxide layer 716 may be 1 nm thinner.

To compensate for the additional (tunneling) oxide layer 740, the top oxide layer 716 can be thinned on a 1-to-1 basis. In other words, for every 1 nm of tunneling oxide 740 which is added, the top oxide layer 716 may be 1 nm thinner.

Since SiON has approximately 1.5 times the dielectric constant of oxide, 6 nm of SiON has the equivalent dielectric property (or "oxide equivalent" thickness) as 4 nm of oxide. Therefore, to maintain an electrical characteristic of the ONO stack comparable to a conventional NROM cell (FIG. 1), for every 3 nm of SiON 734 which is added, the top oxide layer 716 may be 2 nm thinner.

However, the top oxide layer 716 should be at least 3 nm.

The thickness of the nitride storage layer 714 may be approximately 3-8 nm, such as 4 nm, or substantially unchanged from the conventional NROM.

The thickness of the bottom oxide layer 712 may be approximately 3-6 nm, such as 4 nm, or substantially unchanged from the conventional NROM.

To perform erase, by hole tunneling from the gate, the following voltages may be applied:
the gate voltage (Vg) may be approximately +10 v
the diffusion voltages (Vs and Vd) may both be same as substrate or float
the substrate voltage (Vb or Vsub) may be approximately −8 v Notice that both diffusions are biased the same, since the erase operation is for the entire cell (both half cells). The potential difference between gate and substrate (or gate and well, $V_{GW}$) may be approximately 14-18 volts.

The gate 720 may be heavily P+ doped poly-Si to provide a better (than N+) hole supply. For example, boron (B) at a dose of 1e16/cm² at an energy level of 9 KeV, or BF2 at a dose of 1e16/cm² at an energy level of 40 KeV.

Programming of the NROM cell 700 may proceed as usual, inserting electrons into the left and right bits (charge-storage areas) 714L and 714R of the charge-storage layer 714, such as with CHE or CHISEL injection mechanisms.

Embodiment #4

FIG. 8 shows an embodiment of an NROM cell 800 with a top injector. The NROM cell 800 is similar to the NROM cell 100 of FIG. 1, and comprises:
a substrate 802 (compare 102);
two spaced-apart diffusions 804 and 806 (compare 104 and 106);
a channel between 808 (compare 108) disposed in the substrate 802, between the diffusions 804 and 806;
an ONO stack 810 (compare 110) disposed on a surface of the substrate 802, above the channel 808; and
a gate 820 (compare 120) disposed above the ONO stack 810.

The ONO stack 810 comprises a bottom oxide layer 812 (compare 112), a storage nitride layer 814 (compare 114), and a top oxide layer 816 (compare 116). The storage nitride layer has a left bit (charge-storage area) 814L (compare 114L) and a right bit (charge-storage area) 814R (compare 114R). Exemplary approximate dimensions for the layers 812, 814 and 816 of the ONO stack 810 are set forth in the table above (under "FIG. 8 SiRN/SiON injector").

Various voltages Vg, Vd, Vs and Vsub which may be applied to the gate 820, diffusions 804 and 806, and substrate (or P-well) 802 are shown, and may be discussed hereinbelow.

The NROM cell 800 further comprises a nitride-based, top injector layer 830 disposed between the ONO stack 810 and the gate 820, more particularly between the top oxide layer 616 of the ONO stack and the gate 820. The nitride-based injector layer 830 may comprise a single layer of silicon-rich nitride (SiRN), having a stoichiometry of $Si_xN_y$ (more than 3 parts silicon and/or fewer than 4 parts nitrogen. A non-limiting example of SiRN is $Si_7N_8$ (7 parts silicon and 8 parts nitrogen), and may have an exemplary thickness of approximately 2-5 nm, such as 3 nm.

The NROM cell 800 further comprises a layer 840 of oxide ($SiO_2$) disposed atop (on) the nitride-based top injector layer 830, between the top injector layer 830 and the gate 820. The oxide layer 840 separates the silicon-rich nitride 830 from the poly gate 820 and therefore may reduce charge-trapping in the injector silicon-rich nitride 830 (there is no direct contact, meaning no charge transport at zero bias between the "source" and the injector). It may be noted, in the BE-SONOS structure in FIG. 2A, there is an oxide layer "O3" between the "N2" tunneling dielectric and the poly gate. This layer 840 may be referred to as "tunneling oxide". In order to allow charge(s) which may be trapped in the injector to escape (to the gate), this layer 840 should be as thin as possible, and may have an exemplary thickness of 1-2 nm, such as 1.5 nm.

A layer of oxinitride (SiON) 834 may be disposed (inserted) between the layer 830 of silicon rich nitride (SiRN) and the top oxide layer 816 of the ONO stack 810, and may have an exemplary thickness of approximately 2-5 mm, such as 3 mm. The addition of the SiON layer 834 reduces the amount of silicon rich nitride (SiRN) 830 needed, and hence may reduce the amount of charge trapping inside the silicon rich nitride (SiRN) layer 830, without affecting the hole-tunneling efficiency.

In order to compensate for the addition of the nitride-based top injector layer 830, and additional (tunneling) oxide 840, and the additional SiON layer 834, the top oxide layer 516 of the ONO stack 810 may be made thinner than in a conventional (or "standard") NROM (such as 100, FIG. 1). For example, whereas the top oxide layer 116 in a conventional NROM cell may be 12 nm, the top oxide layer 816 in the NROM cell 800 with top injector may have an exemplary thickness of 3-8 nm, such as 4 nm. In any case, it is desirable to maintain the thickness of this oxide layer 816 to be at least 3 nm, for the purpose of providing good retention of charge(s) in the nitride layer 814.

An appropriate thickness for the top oxide layer 816 may be calculated by taking into account the thicknesses and dielectric constants for the additional layers of nitride and oxide above the top oxide layer 816.

For example, since silicon-rich nitride (SiRN) has approximately twice the dielectric constant of oxide, 8 mm of silicon-rich nitride (SiRN) has the equivalent dielectric property (or "oxide equivalent" thickness) as 4 nm of oxide. Therefore, to compensate for the addition of the injector layer 830, and maintain an electrical characteristic of the ONO stack comparable to that of a conventional NROM cell (FIG. 1), for every 2 mm of silicon-rich nitride (SiRN) 830 which is added, the top oxide layer 816 may be 1 nm thinner.

To compensate for the additional (tunneling) oxide layer 840, the top oxide layer 816 can be thinned on a 1-to-1 basis. In other words, for every 1 nm of tunneling oxide 840 which is added, the top oxide layer 816 may be 1 nm thinner.

Since SiON has approximately 1.5 times the dielectric constant of oxide, 6 nm of SiON has the equivalent dielectric property (or "oxide equivalent" thickness) as 4 mm of oxide. Therefore, to maintain an electrical characteristic of the ONO stack comparable to a conventional NROM cell (FIG. 1), for every 3 nm of SiON 834 which is added, the top oxide layer 816 may be 2 nm thinner.

However, the top oxide layer 816 should be at least 3 ran.

The thickness of the nitride storage layer 814 may be approximately 3-8 nm, such as 4 nm, or substantially unchanged from the conventional NROM.

The thickness of the bottom oxide layer 812 may be approximately 3-6 nm, such as 4 nm, or substantially unchanged from the conventional NROM.

To perform erase, by hole tunneling from the gate, the following voltages may be applied:
- the gate voltage (Vg) may be approximately +10 v
- the diffusion voltages (Vs and Vd) may both be same as substrate or float
- the substrate voltage (Vb or Vsub) may be approximately −8 v Notice that both diffusions are biased the same, since the erase operation is for the entire cell (both half cells). The potential difference between gate and substrate (or gate and well, $V_{GW}$) may be approximately 14-18 volts.

The gate 820 may be heavily P+ doped poly-Si to provide a better (than N+) hole supply. For example, boron (B) at a dose of 1e16/cm² at an energy level of 9 KeV, or BF2 at a dose of 1e16/cm² at an energy level of 40 KeV.

Programming of the NROM cell 800 may proceed as usual, inserting electrons into the left and right bits (charge-storage areas) 814L and 814R of the charge-storage layer 814, such as with CHE or CHISEL injection mechanisms.

Embodiments of NROM Cells with Bottom Injectors and Improved Retention

Four embodiments (#5, #6, #7, #8) of NROM cells with bottom injector will be described, and are illustrated in FIGS. 9-12. These NROM cells may also be referred to as "Channel Erase NROM". An erase operation using these cells may be referred to as "NVM Channel Injection".

The techniques described herein and may be applied to other ONO-based NVM cells, such as SONOS. The NROM cells described herein may be used in Flash memory. An array (plurality) of NVM cells is shown in FIG. 13.

Generally, in each of the NROM cells with bottom injector described herein, the bottom injector comprises at least one nitride-based injector layer which is disposed (inserted) below the ONO stack, between the bottom oxide layer of the ONO stack and the substrate (channel) of an NROM cell. The injector is added to enhance the hole injection, from the substrate to the nitride charge-storage layer of the ONO (charge-storage) stack.

The at least one nitride-based injector layer may comprise a layer of conventional nitride (SiN) or silicon-rich nitride (SiRN). Either SiN or SiRN provides a lower potential barrier for holes (than the bottom oxide layer of the ONO stack), and thereby may increase hole tunneling through to the nitride charge-storage layer of the NROM, thereby enabling an efficient erase operation.

A nitride-based injector such as SiN or SiRN may trap charge, which may adversely affect the overall operation of the NROM cell, such as by biasing measured Vt during an erase verify. (Particularly in NROM cells having two charge-storage areas, incorporating a nitride-based injector that retains charge can alter results during measuring Vt of the cell, or half cell, particularly if the injector performs in a uniform way, across the entire ONO dielectric. In other words, it is not desirable that the injector retain charge.) However, since SiRN is more conductive than SiN, any trapped charge may escape more quickly, such as after an erase pulse, and before the erase verify pulse, thereby minimizing the problem. See, for example, *Nonvolatile Memory Technologies with Emphasis on Flash: A Comprehensive Guide to Understanding and Using Flash Memory Devices*. Edited by Joe E. Brewer, IEEE Press Series on Microelectronic Systems, Wiley, 2007 pp 437-438, incorporated in its entirety by reference herein.

The injector may also comprise a layer of oxide disposed below the nitride-based injector layer. This layer of oxide may be referred to as "tunneling oxide". The tunneling oxide layer should be sufficiently thin that charges which are trapped in the nitride-based injector layer(s) can pass through the tunneling oxide layer to the substrate.

The nitride-based injector may additionally (in addition to a layer of SiN or SiRN) comprise a layer of silicon oxinitride (SiON, may also be spelled oxynitride) disposed (inserted) between the SiN or SiRN layer and the bottom oxide layer of the ONO stack of the NROM cell. (The SiON layer may also be an injector layer.) Generally, the purpose of the SiON layer is to reduce the thickness of the SiN or SiRN layer, thereby reducing charge-trapping within the SiN or SiRN layer of the injector, without adversely affecting hole tunneling efficiency. For example, layers of SiN (or SiRN) and SiON may be inserted between the substrate and the bottom oxide layer of the ONO stack of the NROM cell.

When using such a bottom injector, below the bottom oxide layer of the ONO stack, the bottom oxide layer of the ONO stack may be considered to be part of the injector, although it generally may not be referred to as such, rather referring only to the additional layers below the ONO stack as the "injector".

In order to minimize charges which are stored (or trapped) in the nitride charge-storage layer of the ONO stack from "leaking" into the injector, the bottom oxide layer of the ONO stack may have a thickness of at least 3 nm, thereby providing for good retention of charges in the nitride charge-storage layer of the ONO stack.

The nitride-based injector may be provided in such a way that the good behavior of the NROM cell is maintained substantially intact. For example, adding the bottom injector below the bottom oxide layer of the ONO stack can alter an electrical (such as dielectric) characteristic of the ONO stack. Therefore, the bottom oxide layer of the ONO stack may be thinned, to compensate for the addition of the nitride-based injector, in order to try to maintain an electrical characteristic, such as a "dielectric constant-based electrical thickness" of layer(s) below the storage nitride of the ONO stack substantially the same as in the ONO stack for a conventional NROM cell. However, the bottom oxide layer of the ONO stack should be at least 3 nm thick, to provide adequate insulation below the nitride storage layer, and good retention.

The following dielectric constants (k) are exemplary of the materials discussed herein:

| Oxide | SiO2 | k = 3.9 (2.4 to 4.2) |
|---|---|---|
| Nitride | Si3N4 | k = 7.8 (7.5 to 8.0) |

| | | | |
|---|---|---|
| Silicon-Rich Nitride | SiRN | k = 7.8 (7.5 to 8.0) |
| Oxynitride | SiON | k = 5.8 (4.2 to 7.5) |

Erase of the NROM cells disclosed herein may be performed by hole tunneling from the substrate (from above) through the nitride-based injector, to the nitride charge-storage layer of the ONO stack. Programming of the NROM cells disclosed herein may be performed by conventional electron injection from the channel (from below), such as by using channel hot electron (CHE) or channel-initiated secondary electron (CHISEL) injection. Due to the self-aligned hole-tunneling erase, the mismatch between holes and electrons may be reduced which suppresses the charge redistribution problem. Additionally, Hot Hole Injection, which is considered as a main interface states formation mechanism may be eliminated.

The following table lists typical device parameters for a "standard" NROM cell illustrated in FIG. 1, the channel injection BE-SONOS device illustrated in FIG. 2B, and typical device parameters for the exemplary channel erase NROM cells illustrated in FIGS. 9-12.

because the barrier height between silicon (or polysilicon), relative to electron injection is about 3.1 eV-3.2 eV, and for hole injection is about 4.5-4.8 eV. Therefore, electrons may inject more easily, and accounts for previous techniques of performing −FN tunneling from the gate to increase the Vt of the storage nitride layer.

According to the present disclosure, various structures, mechanisms and techniques for performing hole injection, from the substrate to decrease the Vt of the charge-storage layer, efficiently and effectively, using tunneling. In conjunction with using hole injection from the bottom (from the substrate, or channel) for erase, programming may be performed using conventional electron injection from the bottom (from the substrate, or channel). Although it is possible to reverse the situation and use hole injection from the bottom (from the substrate, or channel) for programming, in conjunction with using electron injection from the bottom (from the substrate, or channel) for erase, in the main hereinafter hole injection is discussed in terms of an erase mechanism. Hole injection may be enhanced to become the dominant mechanism, hence the result will be erase rather than programming.

Figure 9:
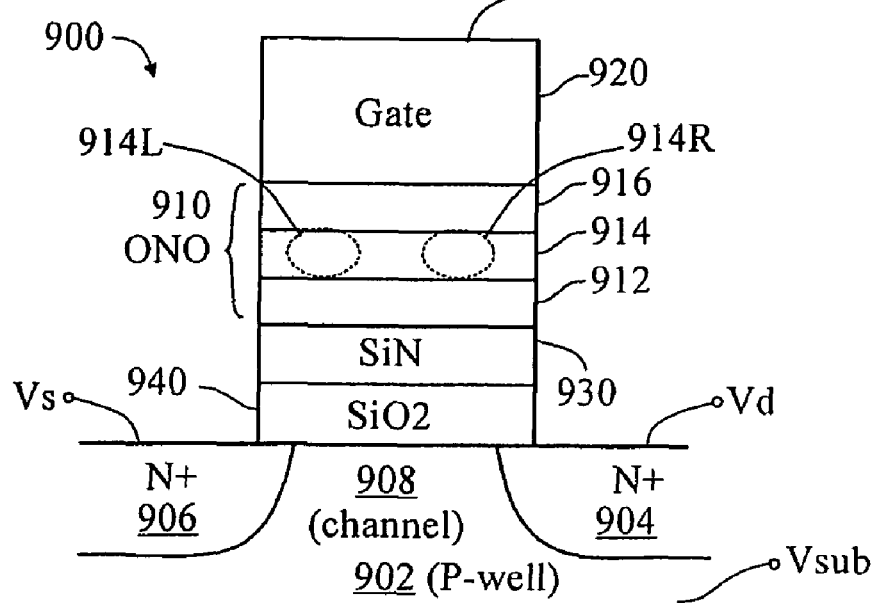
FIG. 9 is a cross-sectional view of an NROM cell, according to an embodiment of the disclosure.
Figure 10:
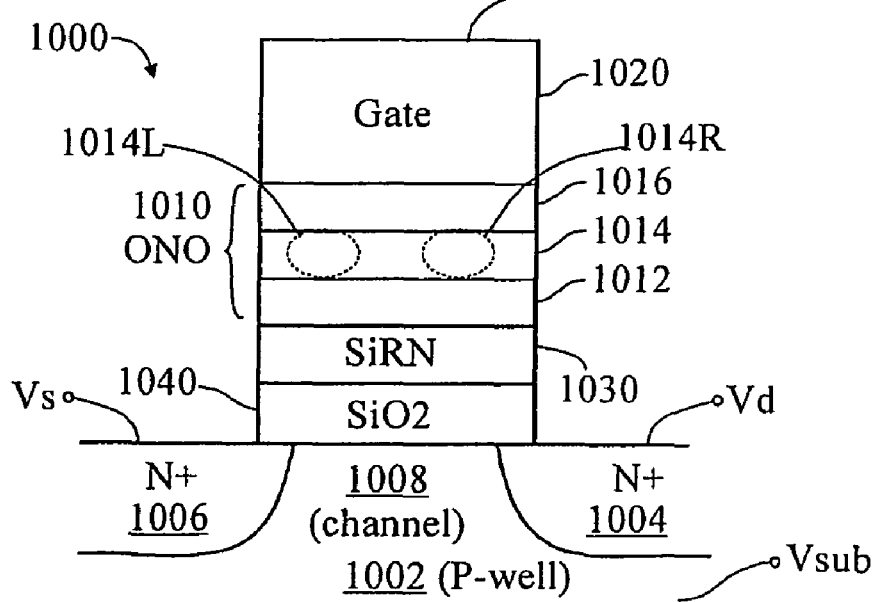
FIG. 10 is a cross-sectional view of an NROM cell, according to an embodiment of the disclosure.
Figure 11:
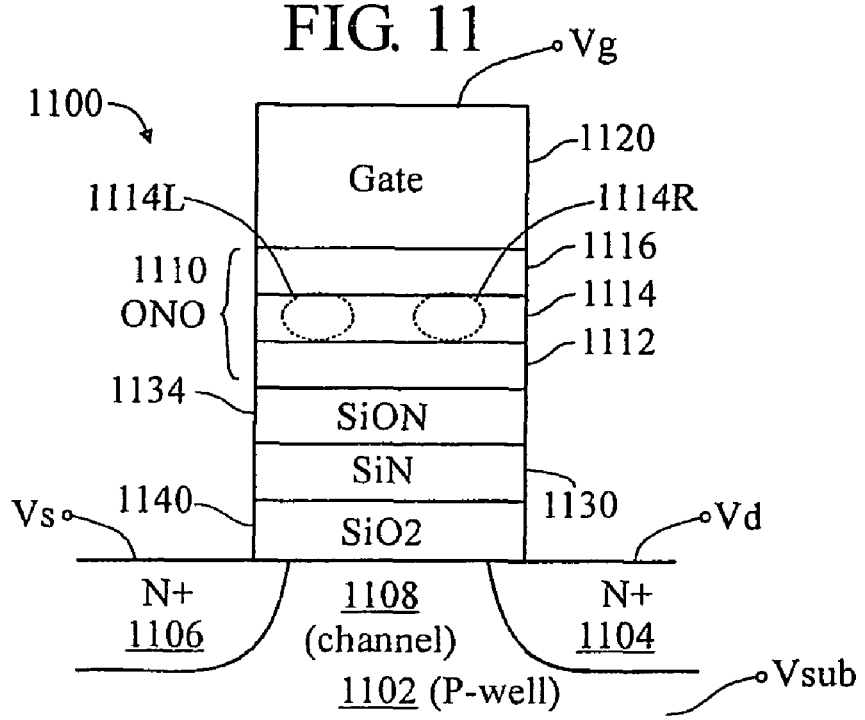
FIG. 11 is a cross-sectional view of an NROM cell, according to an embodiment of the disclosure.
Figure 12:
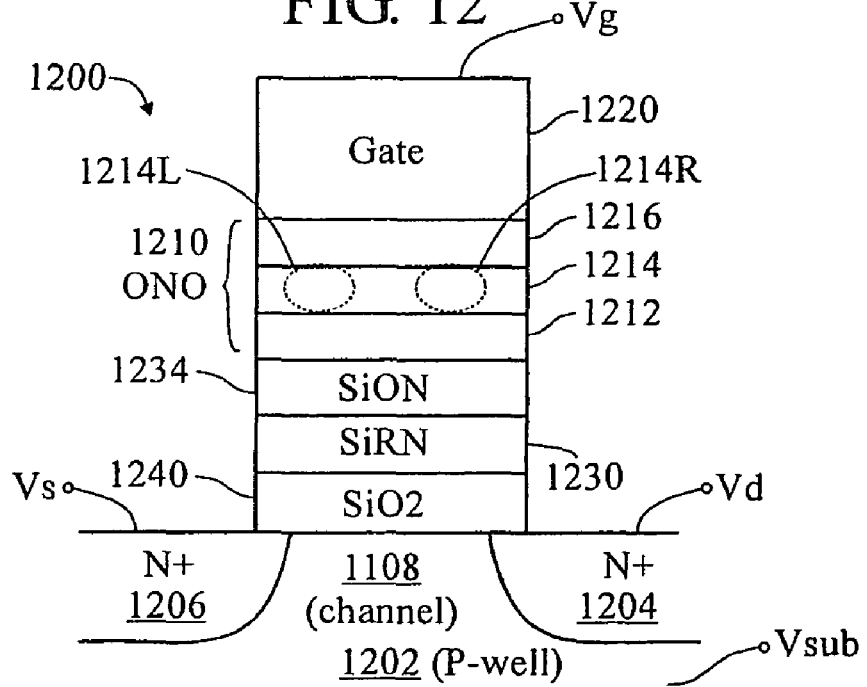
FIG. 12 is a cross-sectional view of an NROM cell, according to an embodiment of the disclosure.

| | FIG. 1 NROM | FIG. 2B BE-SONOS | FIG. 9 Nitride injector | FIG. 10 SiRN injector | FIG. 11 Nitride/SiON injector | FIG. 12 SiRN/SiON injector |
|---|---|---|---|---|---|---|
| Gate | Poly N+ | Poly N | Poly P+ | Poly P+ | Poly P+ | Poly P+ |
| Top Oxide | 12 nm (5-15) | 9.0 nm | 12 nm (5-15) | 12 nm (5-15) | 12 nm (5-15) | 12 nm (5-15) |
| Storage Nitride | 4 nm (3-8) | 7.0 nm | 4 nm (3-8) | 4 nm (3-8) | 4 nm (3-8) | 4 nm (3-8) |
| Bottom Oxide (inter oxide) | 4 (3-6) | 1.8 nm | 3.0 nm (≧3) | 3.0 nm (≧3) | 3.0 nm (≧3) | 3.0 nm (≧3) |
| Oxynitride | -none- | -none- | -none- | -none- | 2.0 nm (2-5) | 2.0 nm (2-5) |
| Nitride-Based Injector Layer | -none- | 2.0 nm | 2.0 nm (2-5) | 2.0 nm (2-5) | 2.0 nm (2-5) | 2.0 nm (2-5) |
| Tunneling Oxide | -none- | 1.5 nm | 1.5 nm (1-2) | 1.5 nm (1-2) | 1.5 nm (1-2) | 1.5 nm (1-2) |
| Well | P well | N well | P well | P well | P well | P well |

Note, in the table above, that for the structures with bottom injectors, the bottom oxide layer of the ONO stack may be thinned to compensate for electrical effects of the underlying injector, in contrast with the BE-SONOS cell (also, in contrast with the "standard NROM" cell), but the storage nitride and top oxide layers of the ONO stack may remain the same as the standard NROM cell.

NROM memory cells may typically be erased using a technique called hot hole injection (HHI), or tunnel enhanced hot hole (TEHH) injection, through the bottom oxide layer of the ONO stack. Some exemplary advantages of the tunneling techniques disclosed herein, as contrasted with HHI or TEHH injection may include:
  scaling and reliability issues and problems are reduced, in comparison with HHI.
  less damage to the bottom oxide layer of the ONO stack.
  Generally, higher voltages but less current may be required to perform erase (as contrasted with HHI).

It should be understood that by applying a high electric field across the NROM cells that are described herein, such as (−) 14V-18V from the gate to the substrate, either hole injection from silicon or electron injection from poly may be achieved. However, it should be understood that, in any structure where there is silicon (or polysilicon) and oxide, the electron injection is much more efficient by tunnelling Embodiment #5

FIG. 9 shows an embodiment of an NROM cell 900 with a bottom injector. The NROM cell 900 is similar to the NROM cell 100 of FIG. 1, and comprises:
  a substrate 902 (compare 102);
  two spaced-apart diffusions 904 and 906 (compare 104 and 106);
  a channel between 908 (compare 108) disposed in the substrate 902, between the diffusions 904 and 906;
  an ONO stack 910 (compare 110) disposed above the channel 908; and
  a gate 920 (compare 120) disposed on top of the ONO stack 910.

The ONO stack 910 comprises a bottom oxide layer 912 (compare 112), a storage nitride layer 914 (compare 114), and a top oxide layer 916 (compare 116). The storage nitride layer has a left bit (charge-storage area) 914L (compare 114L) and a right bit (charge-storage area) 914R (compare 114R). Exemplary approximate dimensions for the layers 912, 914 and 916 of the ONO stack 910 are set forth in the table above (under "FIG. 9 Nitride injector").

Various voltages Vg, Vd, Vs and Vsub which may be applied to the gate 920, diffusions 904 and 906, and substrate (or P-well) 902 are shown, and may be discussed hereinbelow.

The NROM cell 900 further comprises a nitride-based, bottom injector layer 930 disposed between the ONO stack 910 and the substrate 902, more particularly between the bottom oxide layer 912 of the ONO stack and the substrate 902. The nitride-based injector layer 930 may comprise a single layer conventional silicon nitride (SiN), having a stoichiometry of $Si_3N_4$ (3 parts silicon, 4 parts nitrogen), and may have an exemplary thickness of approximately 2-5 nm, such as 2 nm.

The NROM cell 900 further comprises a layer 940 of oxide ($SiO_2$) disposed below (under) the nitride-based bottom injector layer 930, between the bottom injector layer 930 and the substrate 902. (The layer 940 of oxide is disposed on the substrate 902, and injector layer 930 is disposed on the layer 940 of oxide.) The oxide layer 940 separates the nitride 930 from the silicon substrate 902, and therefore may reduce charge-trapping in the injector nitride 930 (there is no direct contact, meaning no charge transport at zero bias between the "source" and the injector). It may be noted, in the BE-SONOS structure in FIG. 2B, there is an oxide layer "O1" between the "N1" tunneling dielectric and the substrate (channel). This layer 940 may be referred to as "tunneling oxide". In order to allow charge(s) which may be trapped in the injector to escape (to the substrate), this layer 940 should be as thin as possible, and may have an exemplary thickness of 1-2 nm, such as 1.5 nm.

In order to compensate for the addition of the nitride-based bottom injector layer 930, and additional (tunneling) oxide 940, the bottom oxide layer 912 of the ONO stack 910 may be made thinner than in a conventional (or "standard") NROM (such as 100, FIG. 1). For example, whereas the bottom oxide layer 112 in a conventional NROM cell may be 4 nm, the bottom oxide layer 912 in the NROM cell 900 with bottom injector may have an exemplary thickness of 3-6 nm, such as 3 nm. In any case, it is desirable to maintain the thickness of this oxide layer 912 to be at least 3 nm, for the purpose of providing good retention of charge(s) in the nitride layer 914.

An appropriate thickness for the bottom oxide layer 912 may be calculated by taking into account the thicknesses and dielectric constants for the additional layers of nitride and oxide below the bottom oxide layer 912.

For example, since nitride (SiN) has approximately twice the dielectric constant of oxide, 8 nm of nitride has the equivalent dielectric property (or "oxide equivalent" thickness) as 4 nm of oxide. Therefore, to compensate for the addition of the injector layer 930, and maintain an electrical characteristic of the ONO stack comparable to that of a conventional NROM cell (FIG. 1), for every 2 nm of nitride 930 which is added, the bottom oxide layer 912 may be 1 nm thinner.

To compensate for the additional (tunneling) oxide layer 940, the bottom oxide layer 912 can be thinned on a 1-to-1 basis. In other words, for every 1 nm of tunneling oxide 940 which is added, the bottom oxide layer 912 may be 1 nm thinner. However, the bottom oxide layer 912 should be at least 3 nm.

The thickness of the nitride storage layer 914 may be approximately 3-8 nm, such as 4 nm, or substantially unchanged from the conventional NROM.

The thickness of the top oxide layer 916 may be approximately 5-15 nm, such as 12 nm, or substantially unchanged from the conventional NROM. The top oxide layer 916 should be at least 3 nm.

To perform erase, by hole tunneling from the gate, the following voltages may be applied:
 the gate voltage (Vg) may be approximately (−)10 v
 the diffusion voltages (Vs and Vd) may both be same as substrate or float
 the substrate voltage (Vb or Vsub) may be approximately (+)8 v Notice that both diffusions are biased the same, since the erase operation is for the entire cell (both half cells). The potential difference between gate and substrate (or gate and well, $V_{GW}$) may be approximately (−)14-18 volts.

The gate 920 may be heavily P+ doped poly-Si to suppress electron supply from the gate. For example, boron (B) at a dose of 1e16/cm² at an energy level of 9 KeV, or BF2 at a dose of 1e16/cm² at an energy level of 40 KeV.

Programming of the NROM cell 900 may proceed as usual, inserting electrons into the left and right bits (charge-storage areas) 914L and 914R of the charge-storage layer 914, such as with CHE or CHISEL injection mechanisms.

Embodiment #6

FIG. 10 shows an embodiment of an NROM cell 1000 with a bottom injector. The NROM cell 1000 is similar to the NROM cell 100 of FIG. 1, and comprises:
 a substrate 1002 (compare 102);
 two spaced-apart diffusions 1004 and 1006 (compare 104 and 106);
 a channel between 1008 (compare 108) disposed in the substrate 1002, between the diffusions 1004 and 1006;
 an ONO stack 1010 (compare 110) disposed above the channel 1008; and
 a gate 1020 (compare 120) disposed on top of the ONO stack 1010.

The ONO stack 1010 comprises a bottom oxide layer 1012 (compare 112), a storage nitride layer 1014 (compare 114), and a top oxide layer 1016 (compare 116). The storage nitride layer has a left bit (charge-storage area) 1014L (compare 114L) and a right bit (charge-storage area) 1014R (compare 114R). Exemplary approximate dimensions for the layers 1012, 1014 and 1016 of the ONO stack 1010 are set forth in the table above (under "FIG. 10 SiRN injector").

Various voltages Vg, Vd, Vs and Vsub which may be applied to the gate 1020, diffusions 1004 and 1006, and substrate (or P-well) 1002 are shown, and may be discussed hereinbelow.

The NROM cell 1000 further comprises a nitride-based, bottom injector layer 1030 disposed between the ONO stack 1010 and the substrate 1002, more particularly between the bottom oxide layer 1012 of the ONO stack and the substrate 1002. The nitride-based injector layer 1030 may comprise a single layer of silicon-rich nitride (SiRN), having a stoichiometry of $Si_xN_y$ (more than 3 parts silicon and/or fewer than 4 parts nitrogen. A non-limiting example of SiRN is $Si_7N_8$ (7 parts silicon and 8 parts nitrogen), and may have an exemplary thickness of approximately 2-5 nm, such as 2 nm.

The NROM cell 1000 further comprises a layer 1040 of oxide ($SiO_2$) disposed below (under) the nitride-based bottom injector layer 1030, between the bottom injector layer 1030 and the substrate 1002. (The layer 1040 of oxide is disposed on the substrate 1002, and injector layer 1030 is disposed on the layer 1040 of oxide.) The oxide layer 1040 separates the silicon-rich nitride 1030 from the silicon substrate 1002, and therefore may reduce charge-trapping in the injector silicon-rich nitride 1030 (there is no direct contact, meaning no charge transport at zero bias between the "source" and the injector). It may be noted, in the BE-SONOS structure in FIG. 2B, there is an oxide layer "O1" between the "N1" tunneling dielectric and the substrate (channel). This layer 1040 may be referred to as "tunneling oxide". In order to allow charge(s) which may be trapped in the injector to escape (to the substrate), this layer 1040 should be as thin as possible, and may have an exemplary thickness of 1-2 nm, such as 1.5 nm.

In order to compensate for the addition of the nitride-based bottom injector layer 1030, and additional (tunneling) oxide 1040, the bottom oxide layer 1012 of the ONO stack 1010 may be made thinner than in a conventional (or "standard") NROM (such as 100, FIG. 1). For example, whereas the bottom oxide layer 112 in a conventional NROM cell may be 4 nm, the bottom oxide layer 1012 in the NROM cell 1000 with bottom injector may have an exemplary thickness of 3-6 nm, such as 3 nm. In any case, it is desirable to maintain the thickness of this oxide layer 1012 to be at least 3 nm, for the purpose of providing good retention of charge(s) in the nitride layer 1014.

An appropriate thickness for the bottom oxide layer 1012 may be calculated by taking into account the thicknesses and dielectric constants for the additional layers of nitride and oxide below the bottom oxide layer 1012.

For example, since silicon-rich nitride (SiRN) has approximately twice the dielectric constant of oxide, 8 nm of silicon-rich nitride has the equivalent dielectric property (or "oxide equivalent" thickness) as 4 nm of oxide. Therefore, to compensate for the addition of the injector layer 1030, and maintain an electrical characteristic of the ONO stack comparable to that of a conventional NROM cell (FIG. 1), for every 2 nm of silicon-rich nitride (SIRN) 1030 which is added, the bottom oxide layer 1012 may be 1 nm thinner.

To compensate for the additional (tunneling) oxide layer 1040, the bottom oxide layer 1012 can be thinned on a 1-to-1 basis. In other words, for every 1 nm of tunneling oxide 1040 which is added, the bottom oxide layer 1012 may be 1 nm thinner.

However, the bottom oxide layer 1012 should be at least 3 nm.

The thickness of the nitride storage layer 1014 may be approximately 3-8 nm, such as 4 nm, or substantially unchanged from the conventional NROM.

The thickness of the top oxide layer 1016 may be approximately 5-15 nm, such as 12 nm, or substantially unchanged from the conventional NROM. The top oxide layer 1016 should be at least 3 nm.

To perform erase, by hole tunneling from the gate, the following voltages may be applied:

the gate voltage (Vg) may be approximately (−)10 v
the diffusion voltages (Vs and Vd) may both be same as substrate or float
the substrate voltage (Vb or Vsub) may be approximately (+)8 v Notice that both diffusions are biased the same, since the erase operation is for the entire cell (both half cells). The potential difference between gate and substrate (or gate and well, $V_{GW}$) may be approximately (−)14-18 volts.

The gate 1020 may be heavily P+ doped poly-Si to suppress electron supply from the gate. For example, boron (B) at a dose of 1e16/cm$^2$ at an energy level of 9 KeV, or BF2 at a dose of 1e16/cm$^2$ at an energy level of 40 KeV.

Programming of the NROM cell 1000 may proceed as usual, inserting electrons into the left and right bits (charge-storage areas) 1014L and 1014R of the charge-storage layer 1014, such as with CHE or CHISEL injection mechanisms.

Embodiment #7

FIG. 11 shows an embodiment of an NROM cell 1100 with a bottom injector. The NROM cell 1100 is similar to the NROM cell 100 of FIG. 1, and comprises:

a substrate 1102 (compare 102);
two spaced-apart diffusions 1104 and 1106 (compare 104 and 106);
a channel between 1108 (compare 108) disposed in the substrate 1102, between the diffusions 1104 and 1106;
an ONO stack 1110 (compare 110) disposed above the channel 1108; and
a gate 1120 (compare 120) disposed on top of the ONO stack 1110.

The ONO stack 1110 comprises a bottom oxide layer 1112 (compare 112), a storage nitride layer 1114 (compare 114), and a top oxide layer 1116 (compare 116). The storage nitride layer has a left bit (charge-storage area) 1114L (compare 114L) and a right bit (charge-storage area) 1114R (compare 114R). Exemplary approximate dimensions for the layers 1112, 1114 and 1116 of the ONO stack 1110 are set forth in the table above (under "FIG. 11 Nitride/SiON injector").

Various voltages Vg, Vd, Vs and Vsub which may be applied to the gate 1120, diffusions 1104 and 1106, and substrate (or P-well) 1102 are shown, and may be discussed hereinbelow.

The NROM cell 900 further comprises a nitride-based, bottom injector layer 1130 disposed between the ONO stack 1110 and the substrate 1102, more particularly between the bottom oxide layer 1112 of the ONO stack and the substrate 1102. The nitride-based injector layer 1130 may comprise a single layer conventional silicon nitride (SiN), having a stoichiometry of $Si_3N_4$ (3 parts silicon, 4 parts nitrogen), and may have an exemplary thickness of approximately 2-5 nm, such as 2 nm.

The NROM cell 1100 further comprises a layer 1140 of oxide ($SiO_2$) disposed below (under) the nitride-based top injector layer 1130, between the bottom injector layer 1130 and the substrate 1102. (The layer 1140 of oxide is disposed on the substrate 1102, and injector layer 1130 is disposed on the layer 1140 of oxide.) The oxide layer 1140 separates the nitride 1130 from the silicon substrate 1102, and therefore may reduce charge-trapping in the injector nitride 1130 (there is no direct contact, meaning no charge transport at zero bias between the "source" and the injector). It may be noted, in the BE-SONOS structure in FIG. 2B, there is an oxide layer "O1" between the "N1" tunneling dielectric and the substrate (channel). This layer 1140 may be referred to as "tunneling oxide". In order to allow charge(s) which may be trapped in the injector to escape (to the substrate), this layer 1140 should be as thin as possible, and may have an exemplary thickness of 1-2 nm, such as 1.5 nm.

A layer of oxinitride (SiON) 1134 may be disposed (inserted) between the layer 1130 of silicon nitride (SiN) and the bottom oxide layer 1112 of the ONO stack 1110, and may have an exemplary thickness of approximately 2-5 nm, such as 2 nm. The addition of the SiON layer 1134 reduces the amount of nitride (SiN) 1130 needed, and hence may reduce the amount of charge trapping inside the nitride layer 1130, without affecting the hole-tunneling efficiency.

In order to compensate for the addition of the nitride-based bottom injector layer 1130, and additional (tunneling) oxide 1140, and the additional SiON layer 1134, the bottom oxide layer 1112 of the ONO stack 1110 may be made thinner than in a conventional (or "standard") NROM (such as 100, FIG. 1). For example, whereas the bottom oxide layer 112 in a conventional NROM cell may be 4 nm, the bottom oxide layer 1112 in the NROM cell 1100 with bottom injector may have an exemplary thickness of 3-6 nm, such as 3 nm. In any case, it is desirable to maintain the thickness of this oxide layer 1112 to be at least 3 nm, for the purpose of providing good retention of charge(s) in the nitride layer 1114.

An appropriate thickness for the bottom oxide layer 1112 may be calculated by taking into account the thicknesses and dielectric constants for the additional layers of silicon-rich nitride, SiON and oxide below the bottom oxide layer 1112.

For example, since nitride (SiN) has approximately twice the dielectric constant of oxide, 8 nm of nitride has the equivalent dielectric property (or "oxide equivalent" thickness) as 4 nm of oxide. Therefore, to compensate for the addition of the injector layer 1130, and maintain an electrical characteristic of the ONO stack comparable to that of a conventional NROM cell (FIG. 1), for every 2 nm of nitride 1130 which is added, the bottom oxide layer 1112 may be 1 nm thinner.

To compensate for the additional (tunneling) oxide layer 1140, the bottom oxide layer 1112 can be thinned on a 1-to-1 basis. In other words, for every 1 nm of tunneling oxide 1140 which is added, the bottom oxide layer 1112 may be 1 nm thinner.

Since SiON has approximately 1.5 times the dielectric constant of oxide, 6 nm of SiON has the equivalent dielectric property (or "oxide equivalent" thickness) as 4 nm of oxide. Therefore, to maintain an electrical characteristic of the ONO stack comparable to a conventional NROM cell (FIG. 1), for every 3 nm of SiON 934 which is added, the bottom oxide layer 1112 may be 2 nm thinner.

However, the bottom oxide layer 1112 should be at least 3 nm.

The thickness of the nitride storage layer 1114 may be approximately 3-8 nm, such as 4 nm, or substantially unchanged from the conventional NROM.

The thickness of the top oxide layer 1116 may be approximately 5-15 nm, such as 12 nm, or substantially unchanged from the conventional NROM. The top oxide layer 1116 should be at least 3 nm.

To perform erase, by hole tunneling from the gate, the following voltages may be applied:
 the gate voltage (Vg) may be approximately (−)10 v
 the diffusion voltages (Vs and Vd) may both be same as substrate or float
 the substrate voltage (Vb or Vsub) may be approximately (+)8 v Notice that both diffusions are biased the same, since the erase operation is for the entire cell (both half cells). The potential difference between gate and substrate (or gate and well, $V_{GW}$) may be approximately (−) 14-18 volts.

The gate 1120 may be heavily P+ doped poly-Si to suppress electron supply from the gate. For example, boron (B) at a dose of 1e16/cm$^2$ at an energy level of 9 KeV, or BF2 at a dose of 1e16/cm$^2$ at an energy level of 40 KeV.

Programming of the NROM cell 1100 may proceed as usual, inserting electrons into the left and right bits (charge-storage areas) 1114L and 1114R of the charge-storage layer 1114, such as with CHE or CHISEL injection mechanisms.

Embodiment #8

FIG. 12 shows an embodiment of an NROM cell 1200 with a bottom injector. The NROM cell 1200 is similar to the NROM cell 100 of FIG. 1, and comprises:

a substrate 1202 (compare 102);
two spaced-apart diffusions 1204 and 1206 (compare 104 and 106);
a channel between 1208 (compare 108) disposed in the substrate 1202, between the diffusions 1204 and 1206;
an ONO stack 1210 (compare 110) disposed above the channel 1208; and
a gate 1220 (compare 120) disposed on top of the ONO stack 1210.

The ONO stack 1210 comprises a bottom oxide layer 1212 (compare 112), a storage nitride layer 1214 (compare 114), and a top oxide layer 1216 (compare 116). The storage nitride layer has a left bit (charge-storage area) 1214L (compare 14L) and a right bit (charge-storage area) 1214R (compare 114R). Exemplary approximate dimensions for the layers 1212, 1214 and 1216 of the ONO stack 1210 are set forth in the table above (under "FIG. 12 SiRN/SiON injector").

Various voltages Vg, Vd, Vs and Vsub which may be applied to the gate 1220, diffusions 1204 and 1206, and substrate (or P-well) 1202 are shown, and may be discussed hereinbelow.

The NROM cell 1200 further comprises a nitride-based, bottom injector layer 1230 disposed between the ONO stack 1010 and the substrate 1002, more particularly between the bottom oxide layer 1012 of the ONO stack and the substrate 1002. The nitride-based injector layer 1030 may comprise a single layer of silicon-rich nitride (SiRN), having a stoichiometry of $Si_xN_y$ (more than 3 parts silicon and/or fewer than 4 parts nitrogen). A non-limiting example of SiRN is $Si_7N_8$ (7 parts silicon and 8 parts nitrogen), and may have an exemplary thickness of approximately 2-5 nm, such as 2 nm.

The NROM cell 1200 further comprises a layer 1240 of oxide ($SiO_2$) disposed below (under) the nitride-based top injector layer 1230, between the bottom injector layer 1230 and the substrate 1202. (The layer 1240 of oxide is disposed on the substrate 1202, and injector layer 1230 is disposed on the layer 1240 of oxide.) The oxide layer 1240 separates the silicon-rich nitride 1230 from the silicon substrate 1202, and therefore may reduce charge-trapping in the injector silicon-rich nitride 1230 (there is no direct contact, meaning no charge transport at zero bias between the "source" and the injector). It may be noted, in the BE-SONOS structure in FIG. 2B, there is an oxide layer "O1" between the "N1" tunneling dielectric and the substrate (channel). This layer 1240 may be referred to as "tunneling oxide". In order to allow charge(s) which may be trapped in the injector to escape (to the substrate), this layer 1240 should be as thin as possible, and may have an exemplary thickness of 1-2 nm, such as 1.5 nm.

A layer of oxinitride (SiON) 1234 may be disposed (inserted) between the layer 1230 of silicon-rich nitride (SiRN) and the bottom oxide layer 1212 of the ONO stack 1210, and may have an exemplary thickness of approximately 2-5 nm, such as 2 nm. The addition of the SiON layer 1234 reduces the amount of silicon-rich nitride (SiRN) 1130 needed, and hence may reduce the amount of charge trapping inside the silicon-rich nitride layer 1230, without affecting the hole-tunneling efficiency.

In order to compensate for the addition of the nitride-based bottom injector layer 1230, and additional (tunneling) oxide 1240, and the additional SiON layer 1234, the bottom oxide layer 1212 of the ONO stack 1210 may be made thinner than in a conventional (or "standard") NROM (such as 100, FIG. 1). For example, whereas the bottom oxide layer 112 in a conventional NROM cell may be 4 nm, the bottom oxide layer 1212 in the NROM cell 1200 with bottom injector may have an exemplary thickness of 3-6 nm, such as 3 nm. In any case, it is desirable to maintain the thickness of this oxide layer 1212 to be at least 3 nm, for the purpose of providing good retention of charge(s) in the nitride layer 1214.

An appropriate thickness for the bottom oxide layer 1212 may be calculated by taking into account the thicknesses and dielectric constants for the additional layers of silicon-rich nitride, SiON and oxide below the bottom oxide layer 1212.

For example, since silicon-rich nitride (SiRN) has approximately twice the dielectric constant of oxide, 8 nm of silicon-rich nitride has the equivalent dielectric property (or "oxide equivalent" thickness) as 4 nm of oxide. Therefore, to compensate for the addition of the injector layer 1230, and maintain an electrical characteristic of the ONO stack comparable to that of a conventional NROM cell (FIG. 1), for every 2 nm of silicon-rich nitride (SiRN) 1230 which is added, the bottom oxide layer 1212 may be 1 nm thinner.

To compensate for the additional (tunneling) oxide layer 1240, the bottom oxide layer 1212 can be thinned on a 1-to-1 basis. In other words, for every 1 nm of tunneling oxide 1240 which is added, the bottom oxide layer 1212 may be 1 nm thinner.

Since SiON has approximately 1.5 times the dielectric constant of oxide, 6 nm of SiON has the equivalent dielectric property (or "oxide equivalent" thickness) as 4 nm of oxide. Therefore, to maintain an electrical characteristic of the ONO stack comparable to a conventional NROM cell (FIG. 1), for every 3 nm of SiON 1234 which is added, the bottom oxide layer 1212 may be 2 nm thinner.

However, the bottom oxide layer 1212 should be at least 3 nm.

The thickness of the nitride storage layer 1214 may be approximately 3-8 nm, such as 4 nm, or substantially unchanged from the conventional NROM.

The thickness of the top oxide layer 1216 may be approximately 5-15 nm, such as 12 nm, or substantially unchanged from the conventional NROM. The top oxide layer 1216 should be at least 3 nm.

To perform erase, by hole tunneling from the gate, the following voltages may be applied:
the gate voltage (Vg) may be approximately (−)10 v
the diffusion voltages (Vs and Vd) may both be same as substrate or float
the substrate voltage (Vb or Vsub) may be approximately (+)8 v Notice that both diffusions are biased the same, since the erase operation is for the entire cell (both half cells). The potential difference between gate and substrate (or gate and well, $V_{GW}$) may be approximately (−)14-18 volts.

The gate 1220 may be heavily P+ doped poly-Si to suppress electron supply from the gate. For example, boron (B) at a dose of 1e16/cm$^2$ at an energy level of 9 KeV, or BF2 at a dose of 1e16/cm$^2$ at an energy level of 40 KeV.

Programming of the NROM cell 1200 may proceed as usual, inserting electrons into the left and right bits (charge-storage areas) 1214L and 914R of the charge-storage layer 1214, such as with CHE or CHISEL injection mechanisms.

Improved Retention

For top injectors (including Gate-Erase NROM), in order to improve retention of charges in the charge-storage layer 314, 514, 614, 714, 814, the top ("injector-side") insulating layer 316, 516, 616, 716, 816 of the charge-storage stack should have a thickness of at least 3 nm. And, for the bottom injectors (including Channel-Erase NROM), in order to improve retention of charges in the charge-storage layer 414, 914, 1014, 1114, 1214, the bottom ("injector-side") insulating layer 412, 912, 1012, 1112, 1212 of the charge-storage stack should have a thickness of at least 3 nm.

"Retention" may be characterized by measuring charge loss, such as (for example) during 1 hour at an elevated temperature such as 200° C. (which emulates a longer time at room temperature), after performing one or more (such as 1000) cycles of program and erase. A charge loss of less than 1 volt, under these conditions, may be characterized as "good", for some products.

Some tests have been made indicating that having an "injector-side insulating layer" in the charge-storage stack of at least 3 nm provides for "good" retention, and having an "injector-side insulating layer" in the charge-storage stack of less than 3 nm fails to provide for "good" retention.

Electron Erase State

In the descriptions set forth hereinabove, performing erase by hole tunneling is discussed. A feature of the disclosure is to enhance hole tunneling during the erase operation, without increasing electron "back tunneling" (including suppressing electron back tunneling). One way of achieving this is to change the structure, such as by adding the injector and P+ poly, as described hereinabove. Another way would be to define an erased state as an electron state, meaning that even in the erased state there will be electrons (a non-zero amount of charge) in the storage nitride. (Usually in NROM, erased state is defined as neutral, or substantially no charge state.) By establishing an electron erase state, there will be electrons in the storage nitride in both the programmed and erased states. Thus, during an erase operation those electrons may attract the holes, thereby enhancing hole tunneling. And, back tunneling of electrons may be suppressed due to the rejection (repulsion) of the stored electrons. Therefore changing the erased state to be an electron state (rather than a neutral state) may enhances hole tunneling and suppresses electron back tunneling during erase.

Bottom Versus Top Injector(s)

Several embodiments of top and bottom injectors have been described hereinabove. There may be some benefits to each. For example (without limitation):

1. In the bottom injector(s) there might be trapping material (such as nitride) as part of the injector. Due to its location near the channel, the sensitivity to the trapped charge in the injector itself may be large (even greater that to the charge trapped in the storage nitride). As a result the device may be sensitive to the trapping in the injector part, which may harm its operations since electrons may be trapped in it during programming and holes may be trapped during erase.
2. In the top injector(s) this problem (trapping of charge in the injector) is partially solved, since the injector is located farther from the channel and has much smaller sensitivity and, as such, a lesser influence on the device operation. However when using a top injector, both programming, read and erase may typically be performed with same polarity, meaning with positive gate substrate bias. Therefore the problem of "disturbs" might rise. Since, when one of the cells is programmed, nearby programmed cell on the same wordline may have the same positive gate voltage (Vg) and might start with slow erase. This problem may not exist for the bottom injector(s) due to different operation polarities (programming with positive bias and erase with negative one).

An Exemplary Memory Array

FIG. 13 illustrates an "array" of a plurality of NVM cells (labeled "a" through "i", also referred to as "cell transistors"), arranged in rows and columns, and connected to a number of word lines (WL) and bit lines (BL). The bitlines (BLs) may extend parallel to each other in one direction (horizontally, as shown) through the array, and the wordlines (WLs) may extend parallel to each other in another direction (vertically, as shown) through the array. The nine memory cells "a" through "i", illustrated in FIG. 13 are exemplary of many millions of memory cells that may be resident on a single semiconductor chip.

The NVM cells "a"-"i" may each have a gate, represented by a line extending upward (as viewed) from the respective memory cell to a wordline, a first diffusion represented by a line extending to the right (as viewed) to a first bitline, and a second diffusion represented by a line extending to the right (as viewed) to a second bitline to the left (as viewed) of the first bitline.

A given wordline (or wordline segment) may be formed as a polysilicon line (or segment) which constitutes gates of a number of NVM cells which are in the same row as one another—for example, the wordline (n) extending across the gates of cells "d", "e" and "f").

A given bitline (or bitline segment) may be formed as first or second diffusions of a number of NVM cells which are in the same column as one another—for example, the bitline (n) extending between the right (as viewed) diffusions of cells "a", "d" and "g", which may also be the left (as viewed) diffusions of cells "b", "e" and "h". Such a bitline may be referred to as a "buried bitline" (BB) or as a "diffusion bitline" (DBL), both of which are formed (as diffusions) within the surface of the substrate (not shown).

An inter-level dielectric (ILD, not shown), may be disposed on the substrate to support patterns of metallization for connecting (via contacts, not shown) to the wordlines and bitlines. For example, a portion of the pattern may comprise metal bitlines (MBLs). Contacts to the buried bitlines (BBLs) may be made by metal-filled plugs extending through the ILD to the buried bitlines, such as at intervals of every 16 cells.

The NVM cells shown in FIG. 13 may be charge-trapping devices such as NROM (sometimes referred to as Nitride Read Only Memory), SONOS (Semiconductor Oxide Nitride Oxide Semiconductor; Silicon-Oxide-Nitride-Oxide-Silicon), SANOS (Silicon-Aluminum Oxide-Nitride-Oxide-Silicon), MANOS (Metal-Aluminum Oxide-Nitride-Oxide-Silicon), and TANOS (Tantalum-Aluminum Oxide-Nitride-Oxide-Silicon), and also to Floating Gate (FG) devices, and may incorporate the improving retention in NVM technique(s) disclosed herein.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. A nonvolatile memory (NVM) cell comprising:
a charge-storage stack comprising a charge-storage layer; a channel and a gate, between which said stack is disposed, wherein said channel or said gate is a hole source; and
an injector disposed between said charge-storage stack and said hole source,
wherein said injector further includes a hole permissive layer and an insulator layer adjacent to said hole source, and wherein said hole permissive layer is composed of a material having a potential barrier for holes which is lower than that of an interface of said charge storage stack.

2. The NVM cell according to claim 1, wherein said insulator layer adjacent to said hole source is composed of an oxide.

3. The NVM cell according to claim 1, wherein said insulator layer is at least 3 NM thick.

4. The NVM cell of claim 1, wherein said injector comprises a layer of material having a valence band energy which is higher than that of a top insulating layer of the charge-storage stack.

5. The NVM cell of claim 1, wherein said charge storage layer is composed of charge trapping type material.

6. The NVM cell of claim 5, wherein said charge trapping type material is silicon nitride.

7. The NVM cell of claim 6, wherein said NVM cell is of a type selected from the group consisting of NROM, SONOS and TONOS.

8. The NVM cell of claim 1, wherein said charge storage stack includes one or more insulating layers disposed between said charge storage layer and said gate or channel.

9. The NVM cell of claim 8, wherein said insulating layer comprises oxide and said injector comprises a material selected from the group consisting of nitride (SiN), oxinitride (SiON), and silicon-rich nitride (SiRN).

10. The NVM cell of claim 9, wherein said injector is disposed between said stack and said gate.

11. The NVM cell of claim 9, wherein said injector is disposed between said stack and said channel.

12. The NVM cell of claim 1, wherein said injector comprises a hole permissive layer comprised of gradated hole barrier material having increasing hole-barrier properties moving away from said hole source.

13. The NVM cell of claim 12, wherein said gradated hole barrier material is comprised of at least two layers of dielectric materials arranged such that a potential barrier height peak for holes is near an interface between the injector and said charge-storage stack.

14. The NVM cell of claim 1, wherein: said injector comprises at least one layer of a hole permissive material having a potential barrier for holes which is lower than that of an interface of the charge-storage stack; and said at least one layer of hole permissive material comprises: a first layer of material disposed next to said hole source and having a first potential barrier for holes which is lower than that of an insulating layer of said charge-storage stack; and a second layer of material disposed between the first layer of material and said insulating layer of the charge-storage stack and having a second potential barrier for holes which is lower than that of said insulating layer of the charge-storage stack and higher than that of said first layer of material.

15. The NVM cell of claim 14, wherein: said first layer of material is selected from the group consisting of nitride (SiN) and silicon-rich nitride (SiRN); and said second layer of material comprises oxinitride (SiON).

16. A nonvolatile memory (NVM) cell comprising:
a charge-storage stack comprising a charge-storage layer; a channel and a gate, between which said stack is disposed, wherein said channel or said gate is a hole source; and
an injector disposed between said charge-storage stack and said hole source adjacent to said hole source,
wherein said injector further includes a hole permissive layer and an insulator layer, and wherein said injector comprises a layer of material having a valence band energy which is higher than that of a top insulating layer of the charge-storage stack.

17. The NVM cell according to claim 16, wherein said hole permissive layer is composed of a material having a potential barrier for holes which is lower than that of an interface of said charge storage stack.

18. The NVM cell according to claim 16, wherein said insulator layer adjacent to said hole source is composed of an oxide.

19. The NVM cell according to claim 16, wherein said insulator layer is at least 3 NM thick.

20. The NVM cell of claim 16, wherein said charge storage layer is composed of charge trapping type material.

21. The NVM cell of claim 20, wherein said charge trapping type material is silicon nitride.

22. The NVM cell of claim 21, wherein said NVM cell is of a type selected from the group consisting of NROM, SONOS and TONOS.

23. The NVM cell of claim 16, wherein said charge storage stack includes one or more insulating layers disposed between said charge storage layer and said gate or channel.

24. The NVM cell of claim 23, wherein said insulating layer comprises oxide and said injector comprises a material selected from the group consisting of nitride (SiN), oxinitride (SiON), and silicon-rich nitride (SiRN).

25. The NVM cell of claim 24, wherein said injector is disposed between said stack and said gate.

26. The NVM cell of claim 24, wherein said injector is disposed between said stack and said channel.

27. The NVM cell of claim 16, wherein said injector comprises a hole permissive layer comprised of gradated hole barrier material having increasing hole-barrier properties moving away from said hole source.

28. The NVM cell of claim 27, wherein said gradated hole barrier material is comprised of at least two layers of dielectric materials arranged such that a potential barrier height peak for holes is near an interface between the injector and said charge-storage stack.

29. The NVM cell of claim 16, wherein: said injector comprises at least one layer of a hole permissive material having a potential barrier for holes which is lower than that of an interface of the charge-storage stack; and said at least one layer of hole permissive material comprises: a first layer of material disposed next to said hole source and having a first potential barrier for holes which is lower than that of an insulating layer of said charge-storage stack; and a second layer of material disposed between the first layer of material and said insulating layer of the charge-storage stack and having a second potential barrier for holes which is lower than that of said insulating layer of the charge-storage stack and higher than that of said first layer of material.

30. The NVM cell of claim 29, wherein: said first layer of material is selected from the group consisting of nitride (SiN) and silicon-rich nitride (SiRN); and said second layer of material comprises oxinitride (SiON).

31. A nonvolatile memory (NVM) cell comprising:
a charge-storage stack comprising a charge-storage layer; a channel and a gate, between which said stack is disposed, wherein said channel or said gate is a hole source; and
an injector disposed between said charge-storage stack and said hole source,
wherein said injector further includes a hole permissive layer and an insulator layer adjacent to said hole source, and wherein said injector comprises a hole permissive layer comprised of gradated hole barrier material having increasing hole-barrier properties moving away from said hole source.

32. The NVM cell according to claim 31, wherein said hole permissive layer is composed of a material having a potential barrier for holes which is lower than that of an interface of said charge storage stack.

33. The NVM cell according to claim 31, wherein said insulator layer adjacent to said hole source is composed of an oxide.

34. The NVM cell according to claim 31, wherein said insulator layer is at least 3 NM thick.

35. The NVM cell according to claim 31, wherein said injector comprises a layer of material having a valence band energy which is higher than that of a top insulating layer of the charge-storage stack.

36. The NVM cell of claim 31, wherein said charge storage layer is composed of charge trapping type material.

37. The NVM cell of claim 36, wherein said charge trapping type material is silicon nitride.

38. The NVM cell of claim 37, wherein said NVM cell is of a type selected from the group consisting of NROM, SONOS and TONOS.

39. The NVM cell of claim 31, wherein said charge storage stack includes one or more insulating layers disposed between said charge storage layer and said gate or channel.

40. The NVM cell of claim 39, wherein said insulating layer comprises oxide and said injector comprises a material selected from the group consisting of nitride (SiN), oxinitride (SiON), and silicon-rich nitride (SiRN).

41. The NVM cell of claim 40, wherein said injector is disposed between said stack and said gate.

42. The NVM cell of claim 40, wherein said injector is disposed between said stack and said channel.

43. The NVM cell of claim 31, wherein said gradated hole barrier material is comprised of at least two layers of dielectric materials arranged such that a potential barrier height peak for holes is near an interface between the injector and said charge-storage stack.

44. The NVM cell of claim 31, wherein: said injector comprises at least one layer of a hole permissive material having a potential barrier for holes which is lower than that of an interface of the charge-storage stack; and said at least one layer of hole permissive material comprises: a first layer of material disposed next to said hole source and having a first potential barrier for holes which is lower than that of an insulating layer of said charge-storage stack; and a second layer of material disposed between the first layer of material and said insulating layer of the charge-storage stack and having a second potential barrier for holes which is lower than that of said insulating layer of the charge-storage stack and higher than that of said first layer of material.

45. The NVM cell of claim 44, wherein: said first layer of material is selected from the group consisting of nitride (SiN) and silicon-rich nitride (SiRN); and said second layer of material comprises oxinitride (SiON).

46. A nonvolatile memory (NVM) cell comprising:
a charge-storage stack comprising a charge-storage layer; a channel and a gate, between which said stack is disposed, wherein said channel or said gate is a hole source; and
an injector disposed between said charge-storage stack and said hole source, wherein said injector further includes a hole permissive layer and an insulator layer adjacent to said hole source, and
wherein said injector comprises at least one layer of a hole permissive material having a potential barrier for holes which is lower than that of an interface of the charge-storage stack; and said at least one layer of hole permissive material comprises:
- a first layer of material disposed next to said hole source and having a first potential barrier for holes which is lower than that of an insulating layer of said charge-storage stack; and
- a second layer of material disposed between the first layer of material and said insulating layer of the charge-storage stack and having a second potential barrier for holes which is lower than that of said insulating layer of the charge-storage stack and higher than that of said first layer of material.

47. The NVM cell according to claim 46, wherein said hole permissive layer is composed of a material having a potential barrier for holes which is lower than that of an interface of said charge storage stack.

48. The NVM cell according to claim 46, wherein said insulator layer adjacent to said hole source is composed of an oxide.

49. The NVM cell according to claim 46, wherein said insulator layer is at least 3 NM thick.

50. The NVM cell according to claim 46, wherein said injector comprises a layer of material having a valence band energy which is higher than that of a top insulating layer of the charge-storage stack.

51. The NVM cell of claim 46, wherein said charge storage layer is composed of charge trapping type material.

52. The NVM cell of claim 51, wherein said charge trapping type material is silicon nitride.

53. The NVM cell of claim 52, wherein said NVM cell is of a type selected from the group consisting of NROM, SONOS and TONOS.

54. The NVM cell of claim 46, wherein said charge storage stack includes one or more insulating layers disposed between said charge storage layer and said gate or channel.

55. The NVM cell of claim 54, wherein said insulating layer comprises oxide and said injector comprises a material selected from the group consisting of nitride (SiN), oxinitride (SiON), and silicon-rich nitride (SiRN).

56. The NVM cell of claim 55, wherein said injector is disposed between said stack and said gate.

57. The NVM cell of claim 55, wherein said injector is disposed between said stack and said channel.

58. The NVM cell of claim 46, wherein said injector comprises a hole permissive layer comprised of gradated hole barrier material having increasing hole-barrier properties moving away from said hole source.

59. The NVM cell of claim 58, wherein said gradated hole barrier material is comprised of at least two layers of dielectric materials arranged such that a potential barrier height peak for holes is near an interface between the injector and said charge-storage stack.

60. The NVM cell of claim 46, wherein: said first layer of material is selected from the group consisting of nitride (SiN) and silicon-rich nitride (SiRN); and said second layer of material comprises oxinitride (SiON).

* * * * *